United States Patent

Murase et al.

(10) Patent No.: US 9,048,445 B2
(45) Date of Patent: Jun. 2, 2015

(54) GATE INSULATING MATERIAL, GATE INSULATING FILM AND ORGANIC FIELD-EFFECT TRANSISTOR

(75) Inventors: Seiichiro Murase, Shiga (JP); Takenori Fujiwara, Shiga (JP); Yukari Jo, Shiga (JP); Jun Tsukamoto, Shiga (JP)

(73) Assignee: TORAY INDUSTRIES, INC., Tokyo (JP)

( * ) Notice: Subject to any disclaimer, the term of this patent is extended or adjusted under 35 U.S.C. 154(b) by 1237 days.

(21) Appl. No.: 12/933,417

(22) PCT Filed: Feb. 27, 2009

(86) PCT No.: PCT/JP2009/053628
§ 371 (c)(1),
(2), (4) Date: Dec. 2, 2010

(87) PCT Pub. No.: WO2009/116373
PCT Pub. Date: Sep. 24, 2009

(65) Prior Publication Data
US 2011/0068417 A1    Mar. 24, 2011

(30) Foreign Application Priority Data

Mar. 18, 2008    (JP) .................................. 2008-068931

(51) Int. Cl.
*H01L 29/78*    (2006.01)
*H01L 51/05*    (2006.01)
(Continued)

(52) U.S. Cl.
CPC ............. *H01L 51/052* (2013.01); *C08G 59/306* (2013.01); *C08G 59/3281* (2013.01);
(Continued)

(58) Field of Classification Search
CPC ............. H01L 51/052; H01L 21/3122; H01L 21/02282; H01L 21/02216; H01L 51/0545; H01L 51/0036; H01B 3/40; H01B 3/46; G03F 7/0757; C08G 65/20; C08G 77/14; C08F 7/0757; C08G 59/3281; C08G 59/306; C09D 163/00
USPC ........................................................ 257/410
See application file for complete search history.

(56) References Cited

U.S. PATENT DOCUMENTS 8,030,644 B2 * 10/2011 Shin et al. ....................... 257/40

FOREIGN PATENT DOCUMENTS

JP    2007-154164 A    6/2007
JP    2007-193318 A    8/2007

OTHER PUBLICATIONS

International Search Report in related application PCT/JP2009/053628 mailed Apr. 14, 2009.

*Primary Examiner* — William D Coleman
(74) *Attorney, Agent, or Firm* — Pillsbury Winthrop Shaw Pittman LLP

(57) ABSTRACT

To provide a gate insulating material which has high chemical resistance, is superior in coatability of a resist and an organic semiconductor coating liquid, and has small hysteresis, a gate insulating film and an FET using the same by a polysiloxane having an epoxy group-containing silane compound as a copolymerization component.

A gate insulating material containing a polysiloxane having, as copolymerization components, at least a silane compound represented by the general formula (1):

$$R^1{}_m Si(OR^2)_{4-m} \quad (1),$$

wherein $R^1$ represents hydrogen, an alkyl group, a cycloalkyl group, a heterocyclic group, an aryl group, a heteroaryl group or an alkenyl group and in the case where a plurality of $R^1$s are present, $R^1$s may be the same or different, $R^2$ represents an alkyl group or a cycloalkyl group and in the case where a plurality of $R^2$s are present, $R^2$s may be the same or different, and m represents an integer of 1 to 3,
and an epoxy group-containing silane compound represented by the general formula (2):

$$R^3{}_n R^4{}_l Si(OR^5)_{4-n-l} \quad (2),$$

wherein $R^3$ represents an alkyl group or a cycloalkyl group having one or more epoxy groups in a part of a chain and in the case where a plurality of $R^3$s are present, $R^3$s may be the same or different, $R^4$ represents hydrogen, an alkyl group, a cycloalkyl group, a heterocyclic group, an aryl group, a heteroaryl group or an alkenyl group and in the case where a plurality of $R^4$s are present, $R^4$s may be the same or different, $R^5$ represents an alkyl group or a cycloalkyl group and in the case where a plurality of $R^5$s are present, $R^5$s may be the same or different, l represents an integer of 0 to 2, and n represents 1 or 2 (however, l+n≤3).

12 Claims, 1 Drawing Sheet

(51) Int. Cl.
*C08G 59/30* (2006.01)
*C08G 59/32* (2006.01)
*C08G 65/20* (2006.01)
*C08G 77/14* (2006.01)
*C09D 163/00* (2006.01)
*H01L 21/02* (2006.01)
*H01L 21/312* (2006.01)
*G03F 7/075* (2006.01)
*H01B 3/40* (2006.01)
*H01B 3/46* (2006.01)
*H01L 51/00* (2006.01)

(52) U.S. Cl.
CPC ............... *C08G65/20* (2013.01); *C08G 77/14* (2013.01); *C09D 163/00* (2013.01); *H01L 21/02126* (2013.01); *H01L 21/02216* (2013.01); *H01L 21/02282* (2013.01); *H01L 21/3122* (2013.01); *H01L 51/0036* (2013.01); *H01L 51/0068* (2013.01); *H01L 51/0545* (2013.01); *G03F 7/0757* (2013.01); *H01B 3/40* (2013.01); *H01B 3/46* (2013.01)

GATE INSULATING MATERIAL, GATE INSULATING FILM AND ORGANIC FIELD-EFFECT TRANSISTOR

CROSS REFERENCE TO RELATED APPLICATIONS

This is the U.S. National Stage of PCT/JP2009/053628, filed Feb. 27, 2009, which in turn claims priority to Japanese Application No. 2008-068931, filed Mar. 18, 2008, the entire contents of all applications are incorporated herein by reference in their entireties.

TECHNICAL FIELD

The present invention relates to a gate insulating material, a gate insulating film and an organic field-effect transistor.

BACKGROUND ART

In recent years, there have been proposed organic field-effect transistors (hereinafter, referred to as an organic FET) using an organic semiconductor having excellent moldability as a semiconductor layer. Since a circuit pattern can be formed directly on a substrate through an ink-jet technique or screening technique by using the organic semiconductor as an ink, organic FETs using the organic semiconductor are actively studied in place of conventional field-effect transistors (hereinafter, referred to as an FET) using inorganic semiconductors. An important measure of FET performance is mobility. An improvement in the mobility means an increase in an ON-current. This means that a switching characteristic of the FET is improved, and for example, in liquid crystal display devices, this leads to realization of high gradation. For example, in the case of a liquid crystal display device, a mobility of 0.1 $cm^2/V \cdot sec$ or more is required. Another important measure is hysteresis. The hysteresis represents a fluctuating range of a current value corresponding to a voltage hysteresis and the hysteresis value needs to be reduced for stable driving of the FET.

A gate insulating film is an important member of the FET. Generally, a semiconductor layer is formed in film form on a gate insulating layer composed of the gate insulating film, but since a channel, namely a current path is formed in the vicinity of an interface of the gate insulating layer in the semiconductor layer, properties of the gate insulating film (especially a surface thereof) have a large influence on FET characteristics. Common gate insulating films include inorganic films of silicon oxide and the like, but since expensive vacuum equipment such as CVD equipment is required in order to form inorganic films, the cost is increased. Further, this method has a problem that a high-temperature process is required for forming inorganic films and fabrication on a flexible substrate of plastic or the like is difficult. On the other hand, organic materials such as organic polymers have been actively studied because organic materials are soluble in an organic solvent and therefore a thin film can be formed at low cost by an application method such as ink-jet printing, and a gate insulating film can be prepared on the flexible substrate using a low-temperature process.

As an example of gate insulating materials of application type which are soluble in an organic solvent, a combination of polyvinylphenol and a crosslinking agent is known (for example, refer to Non-patent Document 1). However, since large amounts of polar groups such as an amino group and a phenol group remain in the materials, there is a problem of FET characteristics, particularly large hysteresis. Further, if the gate insulating material has such polar groups, in the case of patterning by a resist, the polar group can cause the permeation of chemicals into the insulating film or swelling in the steps of application, development and stripping of the resist to degrade the insulating film. Examples of other gate insulating films include a polysiloxane (for example, refer to Patent Documents 1 to 3), but a polysiloxane has a problem that, because of its high water repellency, the cissing of a coating liquid takes place in a process of applying a resist or an organic semiconductor onto a polysiloxane film and the formation of a uniform film is difficult. On the other hand, a method of improving coatability of a photoresist by a polysiloxane having an epoxy group introduced therein (for example, refer to Patent Document 4) is disclosed, but no example of an FET using the polysiloxane is reported.

Patent Document 1: Japanese Unexamined Patent Publication No. 2004-304121 (CLAIMS)
Patent Document 2: Japanese Unexamined Patent Publication No. 2005-120371 (CLAIMS)
Patent Document 3: Japanese Unexamined Patent Publication No. 2007-258663 (CLAIMS)
Patent Document 4: Japanese Unexamined Patent Publication No. 2007-119744 (CLAIMS)
Non-patent Document 1: "APPLIED PHYSICS LETTERS, vol. 82, p. 4175-4177 (2003)

DISCLOSURE OF THE INVENTION

Problems to be Solved by the Invention

It is an object of the present invention to provide a gate insulating material which is superior in chemical resistance and coatability of a resist and an organic semiconductor coating liquid and realizes small hysteresis, a gate insulating film and an FET using the same.

Means for Solving the Problems

The present invention pertains to a gate insulating material containing a polysiloxane having, as copolymerization components, at least a silane compound represented by the general formula (1):

$$R^1{}_m Si(OR^2)_{4-m} \qquad (1),$$

wherein $R^1$ represents hydrogen, an alkyl group, a cycloalkyl group, a heterocyclic group, an aryl group, a heteroaryl group or an alkenyl group and in the case where a plurality of $R^1$s are present, $R^1$s may be the same or different, $R^2$ represents an alkyl group or a cycloalkyl group and in the case where a plurality of $R^2$s are present, $R^2$s may be the same or different, and m represents an integer of 1 to 3, and an epoxy group-containing silane compound represented by the general formula (2):

$$R^3{}_n R^4{}_l Si(OR^5)_{4-n-l} \qquad (2),$$

wherein $R^3$ represents an alkyl group or a cycloalkyl group having one or more epoxy groups in a part of a chain and in the case where a plurality of $R^3$s are present, $R^3$s may be the same or different, $R^4$ represents hydrogen, an alkyl group, a cycloalkyl group, a heterocyclic group, an aryl group, a heteroaryl group or an alkenyl group and in the case where a plurality of $R^4$s are present, $R^4$s may be the same or different, $R^5$ represents an alkyl group or a cycloalkyl group and in the case where a plurality of $R^5$s are present, $R^5$s may be the same or different, l represents an integer of 0 to 2, and n represents 1 or 2 (however, l+n≤3).

Further, the present invention pertains to a gate insulating film obtained by heat-treating, at a temperature of 100 to 300°

C., a coating film formed by applying the gate insulating material. Furthermore, the present invention pertains to an organic field-effect transistor having a gate electrode, a gate insulating layer, a semiconductor layer, a source electrode and a drain electrode, wherein the gate insulating layer contains the gate insulating film.

EFFECTS OF THE INVENTION

In accordance with the present invention, it is possible to provide a gate insulating material which is superior in chemical resistance and coatability of a resist and an organic semiconductor coating liquid, and realizes small hysteresis, a gate insulating film and an organic field-effect transistor using the same.

Figure 1:
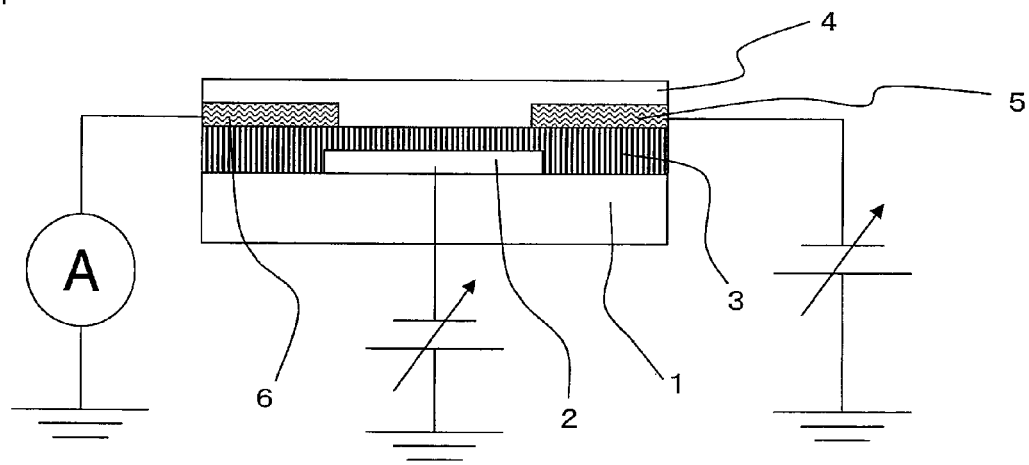
FIG. 1 is a schematic sectional view showing an FET which is an aspect of the present invention.

DESCRIPTION OF THE REFERENCE NUMERALS 1 substrate
2 gate electrode
3 gate insulating layer
4 semiconductor layer
5 source electrode
6 drain electrode

BEST MODE FOR CARRYING OUT THE INVENTION

The polysiloxane of the present invention, having, as copolymerization components, at least a silane compound represented by the general formula (1) and an epoxy group-containing silane compound represented by the general formula (2) will be described in detail.

First, the silane compound represented by the general formula (1) will be described.

$$R^1{}_m Si(OR^2)_{4-m} \quad (1)$$

In the above formula, $R^1$ represents hydrogen, an alkyl group, a cycloalkyl group, a heterocyclic group, an aryl group, a heteroaryl group or an alkenyl group and in the case where a plurality of $R^1$s are present, $R^1$s may be the same or different. $R^2$ represents an alkyl group or a cycloalkyl group and in the case where a plurality of $R^2$s are present, $R^2$s may be the same or different. The subscript m represents an integer of 1 to 3.

The alkyl group represents a saturated aliphatic hydrocarbon group such as a methyl group, an ethyl group, an n-propyl group, an isopropyl group, an n-butyl group, a sec-butyl group or a tert-butyl group, and may have a substituent or may have no substituent. An additional substituent in the case of having a substituent is not particularly limited, and examples thereof include an alkoxy group, an aryl group, and a heteroaryl group, and these additional substituents may further have a substituent. Further, the number of carbon atoms of the alkyl group is not particularly limited, but it is preferably 1 or more and 20 or less, and more preferably 1 or more and 8 or less from the viewpoint of ease of availability and cost.

The cycloalkyl group represents saturated alicyclic hydrocarbon groups such as a cyclopropyl group, a cyclohexyl group, a norbornyl group and an adamantly group, and may have a substituent or may have no substituent. In the case of having a substituent, the substituent is not particularly limited and examples thereof include an alkyl group, an alkoxy group, an aryl group, and a heteroaryl group, and these substituents may further have a substituent. The descriptions about these substituents are common to the following descriptions. The number of carbon atoms of the cycloalkyl group is not particularly limited, but it is preferably 3 or more and 20 or less.

The heterocyclic group represents a group derived from an aliphatic ring, which has atoms other than a carbon atom in the ring, such as a pyran ring, a piperidine ring and an amide ring, and may have a substituent or may have no substituent. The number of carbon atoms of the heterocyclic group is not particularly limited, but it is preferably within the range of 2 or more and 20 or less.

The aryl group represents aromatic hydrocarbon groups such as a phenyl group, a naphthyl group, a biphenyl group, an anthracenyl group, a phenanthryl group, a terphenyl group and a pyrenyl group, and may have a substituent or may have no substituent. The number of carbon atoms of the aryl group is not particularly limited, but it is preferably within the range of 6 or more and 40 or less.

The heteroaryl group represents aromatic groups, which have one or plural atoms other than a carbon atom in the ring, such as a furanyl group, a thiophenyl group, a benzofuranyl group, a dibenzofuranyl group, a pyridyl group and a quinolinyl group, and may have a substituent or may have no substituent. The number of carbon atoms of the heteroaryl group is not particularly limited, but it is preferably within the range of 2 to 30.

The alkenyl group represents unsaturated aliphatic hydrocarbon groups containing a double bond, such as a vinyl group, an allyl group and a butadienyl group, and may have a substituent or may have no substituent. The number of carbon atoms of the alkenyl group is not particularly limited, but it is preferably within the range of 2 or more and 20 or less.

Further, the alkoxy group described above as a substituent represents functional groups, which are formed by substituting an aliphatic hydrocarbon group for one side of an ether bond, such as a methoxy group, an ethoxy group and a propoxy group, and the aliphatic hydrocarbon group may have a substituent or may have no substituent. The number of carbon atoms of the alkoxy group is not particularly limited, but it is preferably within the range of 1 or more and 20 or less.

By introducing a silane compound represented by the general formula (1) into a polysiloxane used for the present invention, it is possible to form a gate insulating film which enhances an insulating property and chemical resistance while maintaining high transparency in a visible light region, and produces fewer traps within an insulating film, which cause hysteresis.

Further, when at least one of m $R^1$s in the general formula (1) is an aryl group or a heteroaryl group, it is preferred since flexibility of the gate insulating film is improved and the occurrence of cracks can be prevented.

Specific examples of the silane compounds represented by the general formula (1) to be used in the present invention include vinyltrimethoxysilane, vinyltriethoxysilane, 3-methacryloxypropyltrimethoxysilane, 3-methacryloxypropyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, phenyltriethoxysilane, p-tolyltrimethoxysilane, benzyltrimethoxysilane, α-naphthyltrimethoxysilane, β-naphthyltrimethoxysilane, 3-aminopropyltriethoxysilane, N-(2-aminoethyl)-3-aminopropyltrimethoxysilane, 3-chloropropyltrimethoxysilane, dimethyldimethoxysilane, dimethyldiethoxysilane, diphenyldimethoxysilane, diphenyldiethoxysilane, methylphenyldimethoxysilane, methylvinyldimethoxysilane, methylvinyldiethoxysilane, 3-aminopropylmethyldimethoxysilane, N-(2-aminoethyl)-3-aminopropylmethyldimethoxysilane, 3-chloropropylmethyldimethoxysilane, 3-chloropropylmethyldiethoxysilane, cyclohexylmethyldimethoxysilane, 3-methacryloxypropyldimethoxysilane, octadecylmethyldimethoxysilane, trimethoxysilane, trifluoroethyl trimethoxysilane, trifluoroethyl triethoxysilane, trifluoroethyl triisopropoxysilane, trifluoropropyltrimethoxysilane, trifluoropropyltriethoxysilane, trifluoropropyltriisopropoxysilane, heptadecafluorodecyl trimethoxysilane, heptadecafluorodecyl triethoxysilane, heptadecafluorodecyl triisopropoxysilane, tridecafluorooctyl triethoxysilane, tridecafluorooctyl trimethoxysilane, tridecafluorooctyl triisopropoxysilane, trifluoroethylmethyl dimethoxysilane, trifluoroethylmethyl diethoxysilane, trifluoroethylmethyl diisopropoxysilane, trifluoropropylmethyl dimethoxysilane, trifluoropropylmethyl diethoxysilane, trifluoropropylmethyl diisopropoxysilane, heptadecafluorodecyl methyldimethoxysilane, heptadecafluorodecyl methyldiethoxysilane, heptadecafluorodecyl methyldiisopropoxysilane, tridecafluorooctyl methyldimethoxysilane, tridecafluorooctyl methyldiethoxysilane, tridecafluorooctyl methyldiisopropoxysilane, trifluoroethylethyl dimethoxysilane, trifluoroethylethyl diethoxysilane, trifluoroethylethyl diisopropoxysilane, trifluoropropylethyl dimethoxysilane, trifluoropropylethyl diethoxysilane, trifluoropropylethyl diisopropoxysilane, heptadecafluorodecyl ethyldimethoxysilane, heptadecafluorodecyl ethyldiethoxysilane, heptadecafluorodecyl ethyldiisopropoxysilane, tridecafluorooctyl ethyldiethoxysilane, tridecafluorooctyl ethyldimethoxysilane, tridecafluorooctyl ethyldiisopropoxysilane, and p-trifluorophenyltriethoxysilane.

It is particularly preferred for increasing the crosslinking density and for improving chemical resistance and the insulating property to use, of the above-mentioned silane compounds, vinyltrimethoxysilane, vinyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, p-tolyltrimethoxysilane, benzyltrimethoxysilane, α-naphthyltrimethoxysilane, β-naphthyltrimethoxysilane, trifluoroethyl trimethoxysilane, trimethoxysilane, or p-trifluorophenyltriethoxysilane, in which m is 1. Further, it is particularly preferred from the viewpoint of the ability of mass production to use vinyltrimethoxysilane, methyltrimethoxysilane, ethyltrimethoxysilane, propyltrimethoxysilane, hexyltrimethoxysilane, octadecyltrimethoxysilane, phenyltrimethoxysilane, p-tolyltrimethoxysilane, benzyltrimethoxysilane, α-naphthyltrimethoxysilane, β-naphthyltrimethoxysilane, trifluoroethyltrimethoxysilane, or trimethoxysilane, in which $R^2$ is a methyl group.

Further, preferred examples of the silane compound include a combination of two or more silane compounds represented by the general formula (1). Among others, a combination of a silane compound having an alkyl group and a silane compound having an aryl group or a heteroaryl group is particularly preferred since this combination can realize a high insulating property and flexibility for preventing the occurrence of cracks simultaneously.

Next, the epoxy group-containing silane compound represented by the general formula (2) will be described.

 (2)

In the above formula, $R^3$ represents an alkyl group or a cycloalkyl group having one or more epoxy groups in a part of a chain and in the case where a plurality of $R^3$s are present, $R^3$s may be the same or different. $R^4$ represents hydrogen, an alkyl group, a cycloalkyl group, a heterocyclic group, an aryl group, a heteroaryl group or an alkenyl group and in the case where a plurality of $R^4$s are present, $R^4$s may be the same or different. $R^5$ represents an alkyl group or a cycloalkyl group and in the case where a plurality of $R^5$s are present, $R^5$s may be the same or different. The subscript l represents an integer of 0 to 2, and n represents 1 or 2 (however, l+n≤3).

The alkyl group or the cycloalkyl group having one or more epoxy groups in a part of a chain, for $R^3$, represents an alkyl group or a cycloalkyl group having a three-membered ether structure, which is formed by coupling of adjacent two carbon atoms with one oxygen atom, in a part of a chain.

Other descriptions about $R^3$ to $R^5$ are similar to those of $R^1$ and $R^2$.

Since the polysiloxane used in the present invention has the epoxy group-containing silane compound represented by the general formula (2), the coatability a resist or an organic semiconductor coating liquid onto the gate insulating film can be improved and an excellent FET having small hysteresis can be obtained.

Specific examples of the epoxy group-containing silane compound represented by the general formula (2) to be used in the present invention include γ-glycidoxypropyltrimethoxysilane, β-(3,4-epoxycyclohexyl)ethyltrimethoxysilane, γ-glycidoxypropyltriethoxysilane, β-(3,4-epoxycyclohexyl)ethyltriethoxysilane, γ-glycidoxypropyltriisopropoxysilane, β-(3,4-epoxycyclohexyl)ethyltriisopropoxysilane, γ-glycidoxypropylmethyldimethoxysilane, β-(3,4-epoxy cyclohexyl)ethylmethyldimethoxysilane, γ-glycidoxypropylmethyldiethoxysilane, β-(3,4-epoxy cyclohexyl)ethylmethyldiethoxysilane, γ-glycidoxypropylmethyldiisopropoxysilane, β-(3,4-epoxycyclohexyl)ethylmethyldiisopropoxysilane, γ-glycidoxypropylethyldimethoxysilane, β-(3,4-epoxy cyclohexyl)ethylethyldimethoxysilane, γ-glycidoxypropylethyldiethoxysilane, β-(3,4-epoxy cyclohexyl)ethylethyldiethoxysilane, γ-glycidoxypropylethyldiisopropoxysilane, β-(3,4-epoxy cyclohexyl)ethylethyldiisopropoxysilane, β-(3,4-epoxy cyclohexyl)propyltrimethoxysilane, and γ-glycidoxyethyltrimethoxysilane.

It is preferred for increasing the crosslinking density and for improving chemical resistance and the insulating property to use, of these compounds, γ-glycidoxypropyltrimethoxysilane, β-(3,4-epoxycyclohexyl)ethyltrimethoxysilane, γ-glycidoxypropyltriethoxysilane, β-(3,4-epoxycyclohexyl)ethyltriethoxysilane, γ-glycidoxypropyltriisopropoxysilane, β-(3,4-epoxycyclohexyl)ethyltriisopropoxysilane, β-(3,4-epoxy cyclohexyl)propyltrimethoxysilane, and γ-glycidoxyethyltrimethoxysilane, in which n is 1 and l is 0. Further, it is particularly preferred from the viewpoint of the ability of mass production to use γ-glycidoxypropyltrimethoxysilane, β-(3,4-epoxycyclohexyl)ethyltrimethoxysilane, β-(3,4-epoxy cyclohexyl)propyltrimethoxysilane and γ-glycidoxyethyltrimethoxysilane, in which $R^5$ is a methyl group.

The polysiloxane used in the present invention can contain other silane compounds besides the silane compounds represented by the general formulas (1) or (2) as the copolymerization components. Examples of other silane compounds include tetramethoxysilane and tetraethoxysilane.

Further, it is preferred that the content of a constituent unit, which is derived from the epoxy group-containing silane compound represented by the general formula (2), in the polysiloxane is 0.1 to 40 mol % with respect to the total of the constituent units of the silane compounds which are copolymerization components of the polysiloxane. When the content of the constituent unit is 0.1 mol % or more, good coatability, in which cissing of the organic semiconductor coating liquid is suppressed, can be attained, and the content of the constituent unit is more preferably 1 mol % or more. On the other hand, when the content of the constituent unit is 40 mol % or less, excellent FET characteristics having small hysteresis can be attained. The content of the constituent unit is more preferably 35 mol % or less.

The polysiloxane used in the present invention can be obtained, for example, by the following method. All the silane compounds are dissolved in a solvent, and to this, an acid catalyst and water are added over 1 to 180 minutes, and then the silane compounds are hydrolyzed at a temperature of room temperature to 80° C. for 1 to 180 minutes. The temperature during the hydrolysis reaction is more preferably room temperature to 55° C. The reaction solution is heated at a temperatures between 50° C. and the boiling point of the solvent for 1 to 100 hours to perform a condensation reaction, thereby obtaining an epoxy group-containing polysiloxane. In this case, since a diol is formed by adding water to the epoxy group in the epoxy group-containing silane compound represented by the general formula (2), it is necessary to add water equivalent or more to the epoxy group in addition to the water equivalent to the alkoxyl group in the whole silane compounds.

Respective conditions for hydrolysis can be decided considering the reaction scale, the size and shape of the reaction vessel, and the like. For example, by setting the acid concentration, the reaction temperature, the reaction time, and the like in appropriate ranges, physical properties suitable for the intended application can be obtained.

Examples of the acid catalyst used for the hydrolysis reaction of the silane compound include formic acid, oxalic acid, hydrochloric acid, sulfuric acid, acetic acid, trifluoroacetic acid, phosphoric acid, polyphosphoric acid, polyhydric carboxylic acid or anhydride thereof, and an ion-exchange resin. The content of the acid catalyst is preferably 0.05 parts by weight or more, and more preferably 0.1 parts by weight or more with respect to 100 parts by weight of all silane compounds which are copolymerization components of the polysiloxane. Further, the content of the acid catalyst is preferably 10 parts by weight or less, and more preferably 5 parts by weight or less. When the content of the acid catalyst is 0.05 parts by weight or more, a hydrolysis reaction adequately proceeds, and when the content of the acid catalyst is 10 parts by weight or less, a rapid reaction can be suppressed.

As the solvent used for the hydrolysis reaction, an organic solvent is preferred. Examples of the organic solvent include alcohols such as ethanol, propanol, butanol, 3-methyl-3-methoxy-1-butanol; glycols such as ethylene glycol and propylene glycol; ethers such as ethylene glycol monomethyl ether, propylene glycol monomethyl ether, propylene glycol monobutyl ether, and diethyl ether; ketones such as methyl isobutyl ketone and diisobutyl ketone; amides such as dimethylformamide and dimethylacetamide; acetates such as ethyl acetate, ethyl cellosolve acetate, and 3-methyl-3-methoxy-1-butanol acetate; and aromatic or aliphatic hydrocarbons such as toluene, xylene, hexane, and cyclohexane; and further γ-butylolactone, N-methyl-2-pyrolidone, and dimethyl sulfoxide. The amount of the solvent is preferably in the range of 50 to 500 parts by weight with respect to 100 parts by weight of all silane compounds which are copolymerization components of the polysiloxane. When the amount of the solvent is 50 parts by weight or more, a rapid reaction can be suppressed, and when the amount of the solvent is 500 parts by weight or less, hydrolysis can adequately proceed.

Further, as the water used for the hydrolysis reaction, ion-exchange water is preferred. The amount of the water can be arbitrarily selected, but water which is molar equivalent or more to an epoxy group may be added in addition to the water molar equivalent to an alkoxyl group in the silane compound. It is also possible to reheat the polysiloxane or to add a basic catalyst thereto for increasing the polymerization degree of the polysiloxane.

The polysiloxane to be used in the present invention, having an epoxy group-containing silane compound as a copolymerization component, is suitably used as a gate insulating material since the polysiloxane has a high insulating property and high chemical resistance and produces less traps within an insulating film, which cause hysteresis. The fact that a polysiloxane contains an epoxy group-containing silane compound can be determined by using various organic analysis techniques such as elemental analysis, nuclear magnetic resonance analysis and infrared spectroscopic analysis singly or in combination of two or more of them.

The gate insulating material of the present invention may contain one or two or more kinds of polysiloxanes. Further, one or more polysiloxanes and one or more silane compounds described above may be mixed for use.

The gate insulating material of the present invention preferably further contains a solvent having a boiling point of 110 to 200° C. at a pressure of 1 atmosphere. Specific examples of the solvent include ethers such as ethylene glycol monomethyl ether, ethylene glycol monoethyl ether, propylene glycol monomethyl ether, propylene glycol monoethyl ether, propylene glycol mono n-butyl ether, propylene glycol mono t-butyl ether, ethylene glycol dimethyl ether, ethylene glycol diethyl ether, ethylene glycol dibutyl ether, and diethylene glycol ethyl methyl ether; acetates such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate, and butyl lactate; ketones such as acetylacetone, methyl propyl ketone, methyl butyl ketone, methyl isobutyl ketone, cyclopentanone, and 2-heptanone; alcohols such as butyl alcohol, isobutyl alcohol, pentanol, 4-methyl-2-pentanol, 3-methyl-2-butanol, 3-methyl-3-methoxybutanol, and diacetone alcohol; and aromatic hydrocarbons such as toluene and xylene. When the boiling point of the solvent is 110° C. or higher, volatilization of the solvent is suppressed in applying the gate insulating material and therefore coatability is improved, and when the boiling point is 200° C. or lower, the amount of the solvent remaining in the film is small and therefore a gate insulating film, which is superior in chemical resistance and the insulating property, is obtained. The boiling point of the solvent is more preferably 130 to 190° C. These solvents may be used alone or in combination of two or more of them.

A preferred content of the solvent is 100 to 1500 parts by weight with respect to 100 parts by weight of the polysiloxane When the content of the solvent is 100 parts by weight or more, volatilization of the solvent is suppressed in applying the gate insulating material and therefore coatability is improved, and when the content is 1500 parts by weight or less, the amount of the solvent remaining in the film is small and therefore a gate insulating film, which is superior in chemical resistance and the insulating property, is obtained.

When two or more solvents are used, it is possible to use one or more solvents having a low boiling point below 110° C. under atmospheric pressure or one or more solvents having a high boiling point above 200° C. under atmospheric pressure.

The gate insulating material of the present invention preferably further contains a particle. The particle preferably has a particle diameter of 100 nm or less and more preferably 50 nm or less from the viewpoint of the planarity of the gate insulating film. The particle is preferably in a sol form from the viewpoint of compatibility with the polysiloxane. Furthermore, the particle is more preferably a particle having a dielectric constant of 3 or more in order to lower the voltage (Vt) of the threshold level of the FET. Specific examples of the particle include silica particles, titania particles, barium titanate particles, zirconia particles, and barium sulfate particles.

The gate insulating material of the present invention preferably further contains a curing agent. As the curing agent, metal alkoxide compounds and metal chelate compounds are preferred, and these compounds may be used in combination.

Specific examples of the preferred metal alkoxide compound include magnesium diethoxide, aluminum triisopropoxide, zirconia tetra-n-buthoxide, zirconia tetra-t-buthoxide, hafnium tetraisopropoxide, and titanium tetraisopropoxide.

Metal chelate compounds can be easily obtained by reacting a chelating agent with a metal alkoxide. Examples of the chelating agent include β-diketones such as acetylacetone, benzoylacetone and dibenzoylmethane, and β-keto-acid esters such as ethyl acetoacetate and ethyl benzoylacetate.

Specific examples of the preferred metal chelate compound include aluminum chelate compounds such as ethyl acetoacetate aluminum diisopropylate, aluminum tris(ethyl acetoacetate), alkyl acetoacetate aluminum diisopropylate, aluminum monoacetylacetate bis(ethyl acetoacetate) and aluminum tris(acetylacetonate); magnesium chelate compounds such as ethyl acetoacetate magnesium monoisopropylate, magnesium bis(ethyl acetoacetate), alkyl acetoacetate magnesium monoisopropylate and magnesium bis(acetylacetonate); zirconia chelate compounds such as zirconia tetrakis(ethylacetoacetate) and zirconia tetrakis(acetylacetonate); and titanium chelate compounds such as titanium tetrakis(ethylacetoacetate) and titanium tetrakis(acetylacetonate). Among these curing agents, preferred curing agents are titanium tetraisopropoxide, aluminum tris(acetylacetonate), aluminum tris(ethyl acetoacetate), magnesium bis(acetylacetonate), magnesium bis(ethyl acetoacetate), zirconia tetrakis(ethylacetoacetate), zirconia tetrakis(acetylacetonate), titanium tetrakis(ethylacetoacetate) and titanium tetrakis(acetylacetonate), and in consideration of storage stability and ease of availability, titanium tetraisopropoxide, aluminum tris(acetylacetonate), aluminum tris(ethyl acetoacetate), zirconia tetrakis(ethylacetoacetate), zirconia tetrakis(acetylacetonate), titanium tetrakis(ethylacetoacetate) and titanium tetrakis(acetylacetonate) are particularly preferred.

The content of the curing agent is preferably 0.1 to 10 parts by weight, and more preferably 1 to 6 parts by weight with respect to 100 parts by weight of the polysiloxane. When the content of the curing agent is 0.1 parts by weight or more, curing adequately proceeds and a gate insulating film having good chemical resistance and a good insulating property is obtained. On the other hand, when the content of the curing agent is 10 parts by weight or less, storage stability of the gate insulating material is good.

The gate insulating material of the present invention may further contain a compound which generates an acid by light, and in this case, the gate insulating material has negative photosensitivity. Examples of the compound which generates an acid by light (photo acid generating agent) include onium salt compounds, halogen-containing compounds, diazoketone compounds, diazomethane compounds, sulfone compounds, sulfonic acid ester compounds, and sulfonimide compounds.

Specific examples of the onium salt compounds include diazonium salts, ammonium salts, iodonium salts, sulfonium salts, phosphonium salts, and oxonium salts. Preferred onium salts include diphenyliodonium triflate, diphenyliodonium pyrenesulfonate, diphenyliodonium dodecylbenzenesulfonate, triphenylsulfonium triflate (trade name "TPS-105" manufactured by Midori Kagaku Co., Ltd.), 4-t-butylphenyl-diphenylsulfonium triflate (trade name "WPAG-339" manufactured by Wako Pure Chemical Industries, Ltd.), 4-methoxyphenyldiphenylsulfonium triflate (trade name "WPAG-370" manufactured by Wako Pure Chemical Industries, Ltd.), triphenylsulfonium nonaflate (trade name "TPS-109" manufactured by Midori Kagaku Co., Ltd.), triphenylsulfonium hexafluoroantimonate, triphenylsulfonium naphthalenesulfonate, and (hydroxyphenyl)benzylmethylsulfonium toluenesulfonate.

Specific examples of the halogen-containing compound include haloalkyl group-containing hydrocarbon compounds and haloalkyl group-containing heterocyclic compounds. Preferred halogen-containing compounds include 1,1-bis(4-chlorophenyl)-2,2,2-trichloroethane, 2-phenyl-4,6-bis(trichloromethyl)-s-triazine, and 2-naphthyl-4,6-bis(trichloromethyl)-s-triazine.

Specific examples of the diazoketone compounds include 1,3-diketo-2-diazo compounds, diazobenzoquinone compounds, diazonaphthoquinone compounds, and the like. Preferred diazoketone compounds include an ester of 1,2-naphthoquinonediazide-4-sulfonic acid and 2,2,3,4,4'-tetrahydroxybenzophenone and an ester of 1,2-naphthoquinonediazide-4-sulfonic acid and 1,1,1-tris(4-hydroxyphenyl)ethane.

Specific examples of the diazomethane compound include bis(trifluorormethylsulfonyl)diazomethane, bis(cyclohexylsulfonyl)diazomethane, bis(phenylsulfonyl)diazomethane, bis(p-tolylsulfonyl)diazomethane, bis(2,4-xylylsulfonyl)diazomethane, bis(p-chlorophenylsulfonyl)diazomethane, methylsulfonyl-p-toluenesulfonyldiazomethane, cyclohexylsulfonyl(1,1-dimethylethylsulfonyl)diazomethane, bis(1,1-dimethylethylsulfonyl)diazomethane and phenylsulfonyl(benzoyl)diazomethane.

Specific examples of the sulfone compounds include β-ketosulfone compounds and β-sulfonylsulfone compounds. Preferred compounds include 4-trisphenacylsulfone, mesitylphenacylsulfone, and bis(phenylsulfonyl)methane.

Examples of the sulfonic acid ester compounds include alkylsulfonic acid esters, haloalkylsulfonic acid esters, arylsulfonic acid esters, and iminosulfonates. Specific examples of the sulfonic acid ester compounds include benzoin tosylate, pyrogallol trimesylate, and nitrobenzyl-9,10-diethoxyanthracene-2-sulfonate.

Specific examples of the sulfonimide compound include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hepto-5-ene-2,3-dicarboxylimide, N-(trifluoromethylsulfonyloxy)-7-oxabicyclo[2.2.1]hepto-5-ene-2,3-dicarboxylimide, N-(trifluoromethylsulfonyloxy)bicyclo[2.2.1]heptane-5,6-oxy-2,3-dicarboxylimide, N-(trifluoromethylsulfonyloxy)naphthyldicarboxylimide, N-(camphorsulfonyloxy)succinimide, N-(camphorsulfonyloxy)phthalimide, N-(camphorsulfonyloxy)diphenylmaleimide, N-(camphorsulfonyloxy)bicyclo[2.2.1]hepto-5-ene-2,3-dicarboxylimide, N-(camphorsulfonyloxy)-7-oxabicyclo[2.2.1]hepto-5-ene-2,3-dicarboxylimide, N-(camphorsulfonyloxy)bicyclo[2.2.1]heptane-5,6-oxy-2,3-dicarboxylimide, N-(camphorsulfonyloxy)naphthyldicarboxylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hepto-5-ene-2,3-dicarboxylimide, N-(4-methylphenylsulfonyloxy)-7-oxabicyclo[2.2.1]hepto-5-ene-2,3-dicarboxylimide, N-(4-methylphenylsulfonyloxy)bicyclo[2.2.1]heptane-5,6-oxy-2,3-dicarboxylimide, N-(4-methylphenylsulfonyoxy)naphthyldicarboxylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1]hepto-5-ene-2,3-dicarboxylimide, N-(2-trifluoromethylphenylsulfonyloxy)-7-oxabicyclo[2.2.1]hepto-5-ene-2,3-dicarboxylimide, N-(2-trifluoromethylphenylsulfonyloxy)bicyclo[2.2.1]heptane-5,6-oxy-2,3-dicarboxylimide, N-(2-trifluoromethylphenylsulfonyloxy)naphthyldicarboxylimide, N-(4-fluorophenylsulfonyloxy)succinimide, N-(2-fluorophenylsulfonyloxy)phthalimide, N-(4-fluorophenylsulfonyloxy)diphenylmaleimide, N-(4-fluorophenylsulfonyloxy)bicyclo[2.2.1]hepto-5-ene-2,3-dicarboxylimide, N-(4-fluorophenylsulfonyloxy)-7-oxabicyclo[2.2.1]hepto-5-ene-2,3-dicarboxylimide, N-(4-fluorophenylsulfonyloxy)bicyclo[2.2.1]heptane-5,6-oxy-2,3-dicarboxylimide, and N-(4-fluorophenylsulfonyloxy)naphthyldicarboxylimide.

Examples of the sulfonimide compound other than the above ones include 5-norbornene-2,3-dicarboxylmidyl triflate (trade name "NDI-105" manufactured by Midori Kagaku Co., Ltd.), 5-norbornene-2,3-dicarboxylmidyl tosylate (trade name "NDI-101" manufactured by Midori Kagaku Co., Ltd.), 4-methylphenylsulfonyloxyimino-α-(4-methoxyphenyl)acetonitrile (trade name "PAI-101" manufactured by Midori Kagaku Co., Ltd.), trifluoromethylsulfonyloxyimino-α-(4-methoxyphenyl)acetonitrile (trade name "PAI-105" manufactured by Midori Kagaku Co., Ltd.), 9-camphorsulfonyloxyimino α-4-methoxyphenylacetonitrile (trade name "PAI-106" manufactured by Midori Kagaku Co., Ltd.), 1,8-naphthalimidyl butanesulfonate (trade name "NAI-1004" manufactured by Midori Kagaku Co., Ltd.), 1,8-naphthalimidyl tosylate (trade name "NAI-101" manufactured by Midori Kagaku Co., Ltd.), 1,8-naphthalimidyl triflate (trade name "NAI-105" manufactured by Midori Kagaku Co., Ltd.), and 1,8-naphthalimidyl nonafluorobutanesulfonate (trade name "NAI-109" manufactured by Midori Kagaku Co., Ltd.). Among these, particularly preferred sulfone compound are TPS-105, WPAG-339, WPAG-370, TPS-109, diphenyliodonium pyrenesulfonate, NDI-105, PAI-101, and NAI-105.

The photo acid generating agent may be used alone or in combination of two or more of them. The content of the photo acid generating agent is preferably 1 to 10 parts by weight, and more preferably 1 to 7 parts by weight with respect to 100 parts by weight of the polysiloxane. When the content of the photo acid generating agent is 1 part by weight or more, formation of patterns can be easily performed, and when the content of the photo acid generating agent is 10 parts by weight or less, affinity for a developer is excellent and the developing property is excellent.

Furthermore, the photo acid generating agent is preferably used in combination with a 9,10-disubstituted anthracene-based compound as a sensitizer. Since the sensitizer does not cause coloring due to a photobleaching reaction, it can achieve high sensitivity while maintaining high transparency even if it remains in the gate insulating film.

Examples of the 9,10-disubstituted anthracene-based compound include 9,10-diphenylanthracene, 9,10-bis(4-methoxyphenyl)anthracene, 9,10-bis(triphenylsilyl)anthracene, 9,10-dimethoxyanthracene, 9,10-diethoxyanthracene, 9,10-dipropoxyanthracene, 9,10-dibutoxyanthracene, 9,10-dipentaoxyanthracene, 2-t-butyl-9,10-dibutoxyanthracene and 9,10-bis(trimethylsilylethynyl)anthracene. Among these, particularly preferred compounds are 9,10-dimethoxyanthracene, 9,10-diethoxyanthracene, 9,10-dipropoxyanthracene, and 9,10-dibutoxyanthracene.

These sensitizers may be used alone or in combination of two or more of them. The content of the sensitizer is preferably 0.05 to 5 parts by weight, and more preferably 0.1 to 3 parts by weight with respect to 100 parts by weight of the polysiloxane. When the content of the sensitizer is 0.05 parts by weight or more, formation of patterns can be easily performed, and when the content of the sensitizer is 5 parts by weight or less, affinity for a developer is excellent and the developing property is excellent.

Further, the sensitizer is not limited to the 9,10-disubstituted anthracene-based compound and a publicly known material can be employed.

In the gate insulating material of the present invention, there are hydrolysates of the silane compounds represented by the general formulas (1) and (2) and other silane compounds, namely, silanol. The silanol is condensed to become siloxane by the action of an acid or a base, and if the condensation of the gate insulating material proceeds during storage, this causes the viscosity to increase and the film thickness of a coating film to change. In the case where the gate insulating material is used for a gate insulating film, a change in the film thickness causes the FET characteristics to vary because the change in the film thickness causes a charge capacity in the insulating film, which is stored during application of a gate voltage, that is, in an on-state, to vary. Therefore, it is preferred to suppress an increase in viscosity by controlling the pH of the gate insulating material to 2 to 7 where the condensation rate of the silanol is low, preferably to 3 to 6. The pH of the gate insulating material can be determined by bringing the gate insulating material into contact with water of the same weight, making them stir, and measuring the pH of the resulting aqueous solution phase. As a method of controlling the pH, a method of washing the gate insulating material with water and a method of removing an excess acid or base with an ion-exchange resin are preferably employed.

Further, the gate insulating material of the present invention may contain a viscosity modifier, a surfactant, a stabilizer, and the like as required.

Examples of the surfactant include fluorine-based surfactants, silicone-based surfactants, polyalkylene oxide-based surfactants, and acrylic surfactants.

Specific examples of the fluorine-based surfactants include 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, hexapropylene glycol di(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, N-[3-(perfluorooctanesulfonamide)propyl]-N,N'-dimethyl-N-ca rboxymethylene ammonium betaine, perfluoroalkylsulfonamide propyltrimethylammonium salt, perfluoroalkyl-N-ethylsulfonylglycine salt, bis(N-perfluorooctylsulfonyl-N-ethylaminoethyl)phosphate and monoperfluoroalkyl ethylphosphoric acid ester. Further, commercially available fluorine-based surfactants include Megafac F142D, Megafac F172, Megafac F173, Megafac F183 (respectively manufactured by DIC Corporation), Eftop EF301, Eftop EF303, Eftop EF352 (respectively manufactured by Shin-Akita Kasei K.K.), Fluorad FC-430, Fluorad FC-431 (respectively manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (respectively manufactured by Asahi Glass Co., Ltd.), BM-1000, BM-1100 (respectively manufactured by Yusho Co., Ltd.), and NBX-15, FTX-218 (respectively manufactured by NEOS Co., Ltd.).

Examples of the silicone-based surfactant include SH-28PA, SH-7PA, SH-21PA, SH-30PA, ST-94PA (respectively manufactured by Toray Dow Corning Silicone Co., Ltd.), and BYK-333 (manufactured by BYK Japan KK). Examples of other surfactants include polyoxyethylene lauryl ether, polyoxyethylene stearyl ether, polyoxyethylene nonylphenyl ether, and polyoxyethylene distearate.

The content of the surfactant is preferably 0.0001 to 1 part by weight with respect to 100 parts by weight of the polysiloxane. Two or more surfactants may be used together.

Next, the gate insulating film of the present invention will be described in detail. The gate insulating film of the present invention is obtained by heat-treating, at a temperature of 100 to 300° C., a coating film formed by applying the gate insulating material of the present invention to a substrate.

Examples of the method of applying the gate insulating material to a substrate include publicly known methods such as a spin coating method, a blade coating method, a slit die coating method, a screen printing method, a bar coating method, a casting method, a transfer printing method, an immersion and withdrawal method, and an ink-jet method. The gate insulating film can be formed by heat-treating the coating film obtained by applying the gate insulating material onto a glass substrate or a plastic substrate by the above-mentioned application method and drying the gate insulating material. Further, when the gate insulating material contains a photo acid generating agent, the gate insulating film can be formed by heat-treating the coating film after exposure and development of the coating film. The drying temperature is preferably 50 to 150° C.

The film thickness of the gate insulating film is preferably 0.01 to 5 µm, and more preferably 0.05 to 1 µm. The temperature of the heat treatment is preferably in the range of 100 to 300° C. The temperature is more preferably in the range of 120 to 200° C. from the viewpoint of formation of the gate insulating film on the plastic substrate.

Here, pattern formation of the coating film formed by using the gate insulating material containing a photo acid generating agent will be described. Chemical rays are irradiated (exposure is performed) through a mask having a desired pattern from above the coating film. Examples of the chemical rays used for exposure include ultraviolet rays, visible rays, electron beam and X-ray, but in the present invention, it is preferred to use an i-line (365 nm), an h-line (405 nm), and a g-line (436 nm) of a mercury lamp. Next, the exposed coating film is developed. As a developer, an aqueous solution of a compound exhibiting alkalinity, such as tetramethylammonium, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, or hexamethylenediamine is preferred and the developer may contain one or two or more compounds exhibiting alkalinity. Further, it is also possible to mix a polar solvent such as N-methyl-2-pyrolidone, N,N-dimethylformamide, N,N-dimethylacetamide, dimethyl sulfoxide, γ-butyrolactone or dimethylacrylamide; an alcohol such as methanol, ethanol, or isopropanol; an ester such as ethyl lactate or propylene glycol monomethyl ether acetate; or a ketone such as cyclopentanone, cyclohexanone, isobutyl ketone, or methyl isobutyl ketone with these alkaline aqueous solutions. After development, the coating film is generally rinsed with water, but the coating film may be rinsed with water added with an alcohol such as ethanol or isopropyl alcohol, or an ester such as ethyl lactate or propylene glycol monomethyl ether acetate.

The gate insulating film of the present invention preferably has a dielectric constant of 3 to 50. The larger the dielectric constant is, the more the voltage of the threshold value of the FET can be reduced.

Further, the gate insulating film of the present invention preferably has a low concentration of an alkali metal, an alkaline earth metal or a halogen ion. Specifically, the concentrations of a heavy metal and a halogen ion are preferably 100 ppm or less, more preferably 1 ppm or less, and furthermore preferably 0.1 ppm or less with respect to the gate insulating material.

Next, an FET, in which the gate insulating film of the present invention is used, will be described. The FET of the present invention is an organic field-effect transistor having a gate electrode, a gate insulating layer, a semiconductor layer, a source electrode and a drain electrode, wherein the gate insulating layer contains the gate insulating film of the present invention.

Figure 2:
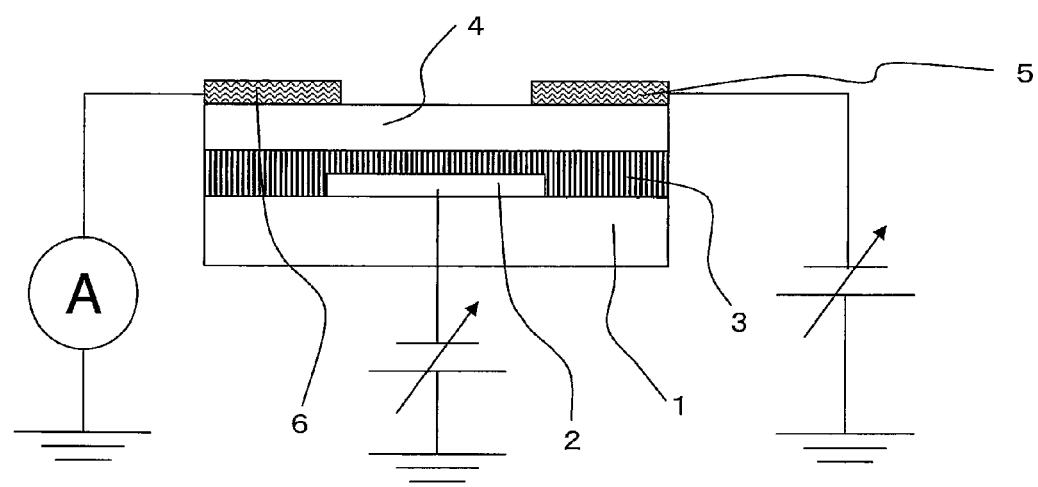
FIG. 2 is a schematic sectional view showing an FET which is another aspect of the present invention.

FIGS. 1 and 2 are schematic sectional views showing examples of the FET of the present invention. In FIG. 1, a source electrode 5 and a drain electrode 6 are formed on a substrate 1 having a gate electrode 2 covered with a gate insulating layer 3 containing the gate insulating film of the present invention, and then a semiconductor layer 4 is further formed thereon. In FIG. 2, the semiconductor layer 4 containing the organic transistor material of the present invention is formed on the substrate 1 having the gate electrode 2 covered with the gate insulating layer 3 containing the gate insulating film of the present invention, and then the source electrode 5 and the drain electrode 6 are further formed thereon.

Examples of the material to be used for the substrate 1 include inorganic materials such as a silicon wafer, glass, and an alumina sintered body, and organic materials such as polyimide, polyester, polycarbonate, polysulfone, polyethersulfone, polyethylene, polyphenylenesulfide, and polyparaxylene.

Examples of the materials to be used for the gate electrode 2, the source electrode 5 and the drain electrode 6 include conductive metal oxides such as tin oxide, indium oxide and indium-tin oxide (ITO); metals such as platinum, gold, silver, copper, iron, tin, zinc, aluminum, indium, chromium, lithium, sodium, potassium, cesium, calcium, magnesium, palladium, molybdenum, amorphous silicon and polysilicon, and alloys thereof; inorganic conductive substances such as copper iodide and copper sulfide; and conductive polymers having improved conductivity by doping of iodine or the like, such as polythiophene, polypyrrole, polyaniline, and a complex of polyethylenedioxythiophene and polystyrenesulfonic acid, but the electrode material is not limited to these. These electrode materials may be used singly, or may be used as a laminate or a mixture of plural materials.

In the FET of the present invention, the gate insulating layer 3 contains the gate insulating film of the present invention. The gate insulating layer 3 is composed of a monolayer or plural layers. In the case of plural layers, a plurality of the gate insulating films of the present invention may be layered, or the gate insulating films of the present invention and a publicly known gate insulating film may be layered. The material of the publicly known gate insulating film is not particularly limited, and inorganic materials such as silicon oxide and alumina, organic polymer materials such as polyimide, polyvinyl alcohol, polyvinyl chloride, polyethylene terephthalate, poly(vinylidene fluoride), polysiloxane, and polyvinylphenol (PVP), and mixtures of an inorganic material powder and an organic polymer material can be used.

The film thickness of the gate insulating layer 3 is preferably 0.01 μm or more and 5 μm or less. By having a film thickness within this range, it becomes easy to form a uniform thin film and it is possible to suppress the current between source and drain which cannot be controlled by a gate voltage and to increase the on/off ratio of the FET. The film thickness can be measured by an atomic force microscope or an ellipsometric method.

Any organic semiconductor may be used for the semiconductor layer 4 regardless of its molecular weight as long as it is a material exhibiting a semiconductive property, and an organic semiconductor which is a material having high carrier mobility can be preferably used. Further, an organic semiconductor soluble in an organic solvent is more preferred and can easily form a semiconductor layer by being applied onto a glass substrate or a plastic substrate in a solution form. The kind of the organic semiconductor is not particularly limited, and examples thereof include polythiophenes such as poly(3-hexylthiophene) and polybenzothiophene; compounds having, in the main chain, a thiophene unit such as poly(2,5-bis (2-thienyl)-3,6-dipentadecylthieno[3,2-b]thiophene), poly (4,8-dihexyl-2,6-bis(3-hexylthiophen-2-yl)benzo[1,2-b:4,5-b']dithiophene), poly(4-octyl-2-(3-octylthiophene-2-yl) thiazole), and poly(5,5'-bis(4-octylthiazole-2-yl)-2,2'-bithiophene; polypyrroles; poly(p-phenylene vinylene)s such as poly(p-phenylene vinylene); polyanilines; polyacetylenes; polydiacetylenes; polycarbazoles; polyfurans such as polyfuran and polybenzofuran; polyheteroaryls having a nitrogen-containing aromatic ring as a constituent unit, such as pyridine, quinoline, phenanthroline, oxazole, and oxadiazole; condensed polycyclic aromatic compounds such as anthracene, pyrene, naphthacene, pentacene, hexacene, and rubrene; nitrogen-containing aromatic compounds such as furan, thiophene, benzothiophene, dibenzofuran, pyridine, quinoline, phenanthroline, oxazole, and oxadiazole; aromatic amine derivatives typified by 4,4'-bis(N-(3-methylphenyl)-N-phenylamino)biphenyl; biscarbazole derivatives such as bis(N-allylcarbazole) and bis(N-alkylcarbazole); pyrazoline derivatives, stilbene-based compounds, hydrazone-based compounds, metal phthalocyanines such as copper phthalocyanine, metal porphyrins such as copper porphyrin, distyrylbenzene derivatives, aminostyryl derivatives, aromatic acetylene derivatives, fused ring tetracarboxylic acid diimides such as naphthalene-1,4,5,8-tetracarboxylic acid diimide and perylene-3,4,9,10-tetracarboxylic acid diimide, and organic dyes such as merocyanine, phenoxazine and rhodamine. The organic semiconductor may contain two or more of them. Among others, an organic semiconductor having a thiophene skeleton is preferred.

Further, examples of another preferred aspect of the semiconductor layer 4 include an aspect in which a composite of an organic semiconductor and a carbon nanotube (CNT) is used. Addition of the CNT is preferably employed as means for improving the mobility of the organic semiconductor.

The weight fraction of the CNT contained in the composite of the organic semiconductor and the CNT is preferably 0.01 to 3% by weight with respect to the organic semiconductor in order to obtain semiconductor characteristics. When the weight fraction is smaller than 0.01% by weight, an effect of adding the CNT is small, and when the weight fraction is larger than 3% by weight, the organic semiconductor composite becomes unsuitable for use as a semiconductor layer since the electric conductivity of the composite increases excessively. The weight fraction is more preferably 2% by weight or less. It becomes easy to realize high mobility and a high on/off ratio simultaneously by setting the weight fraction at 2% by weight or less.

When the composite of the organic semiconductor and the CNT is used for the FET, the length of the CNT is preferably at least shorter than the distance (channel length) between the source electrode and the drain electrode. If the length of the CNT is longer than the channel length, this may cause a short circuit between electrodes. Therefore, it is preferable to use the CNT whose length is at least shorter than the distance (channel length) between the source electrode and the drain electrode or to undergo a step in which the length of the CNT is made shorter than the channel length. The length of a commercially available CNT has some distribution and CNTs longer than the channel length may be contained in the commercially available CNTs. Accordingly, it is preferred to add a step of making the length of the CNT shorter than the channel length and thereby, a short circuit between electrodes can be prevented with reliability. Although the average length of the CNT varies according to the distance between electrodes, it is preferably 5 μm or less, and more preferably 1 μm or less.

Further, the diameter of the CNT is not particularly limited, but it is preferably 1 nm or more and 100 nm or less, and more preferably 50 nm or less.

In the present invention, a CNT having a conjugated polymer adhered to at least a part of the surface thereof is preferably used. Thereby, the CNT can be dispersed more uniformly in a matrix (organic semiconductor) and the high mobility and the high on/off ratio can be realized. A state in which the conjugated polymer adheres to at least a part of the surface of the CNT means a state in which a conjugated polymer covers a part of or the entire surface of the CNT. The reason why the conjugated polymer can cover the CNT is thought to be that it electron clouds resulting from the respective conjugated structures overlap and thereby an interaction is generated. It is possible to determine whether the CNT is covered with the conjugated polymer or not based on the fact that the reflected color of the covered CNT changes from the color of the CNT not covered to the color of the conjugated polymer. The presence of adherents and the weight ratio of the adherents to the CNT can be quantitatively identified by elemental analysis such as X-ray photoelectron spectroscopy (XPS).

Examples of the method of adhering the conjugated polymer to the CNT include (I) a method of adding the CNTs to a melted conjugated polymer and mixing them, (II) a method of dissolving the conjugatedpolymer in a solvent, adding the CNTs to the solvent containing the conjugated polymer and mixing the resulting product, (III) a method of previously dispersing the CNTs ultrasonically, adding the conjugated polymer thereto, and mixing the resulting product, and (IV) a method of putting the conjugated polymer and the CNTs in a solvent and applying an ultrasonic wave to this mixture system to mix them. In the present invention, any method can be selected, and plural methods may be used in combination.

Examples of the conjugated polymer covering the CNT include, but are not particularly limited to, polythiophene-based polymers, polypyrrole-based polymers, polyaniline-based polymers, polyacetylene-based polymers, poly-p-phenylene-based polymers, and poly(p-phenylene vinylene)-based polymers. Among the above-mentioned polymers, polymers in which the same monomer units are lined are preferably used, but polymers obtained by block copolymerization or random copolymerization of different monomer units may also be used. Further, polymers obtained by graft polymerization of different monomer units may also be used. Among the above-mentioned polymers, polythiophene-based polymers, which easily adhere to the CNT and form a CNT composite, are particularly preferably used in the present invention.

For the step of forming the semiconductor layer 4, dry methods such as resistance heating evaporation, an electron beam method, a sputtering method and a CVD method can be employed, but an application method is preferably used from the viewpoint of the production cost or the adaptability for a large area and for taking advantage of benefits that the cissing of the coating liquid is suppressed in the gate insulating layer 3 containing the gate insulating film of the present invention. Specifically, a spin coating method, a blade coating method, a slit die coating method, a screen printing method, a bar coating method, a casting method, a transfer printing method, an immersion and withdrawal method, an ink-jet method and the like can be preferably used. The application method can be selected according to the intended coating film characteristics such as control of a coating film thickness and control of orientation. Further, in order to reduce an effect on the plastic substrate, heat treatment after the application of the coating liquid is preferably performed at a temperature of 220° C. or lower.

The FET thus formed can control a current flowing between the source electrode and the drain electrode by changing the gate voltage. The mobility of the FET can be calculated by use of the following equation (a):

$$\mu=(\delta Id/\delta Vg)L \cdot D/(W \cdot \in_r \cdot \in \cdot Vsd) \qquad (a)$$

wherein Id (A) is the current between the source and the drain, Vsd (V) is the voltage between the source and the drain, Vg (V) is the gate voltage, D (m) is the thickness of the insulating layer, L (m) is the channel length, W (m) is the channel width, $\in_r$ is the dielectric constant of the gate insulating layer, and $\in$ is the dielectric constant ($8.85 \times 10^{-12}$ F/m) in vacuum.

Further, the on/off ratio can be determined from the ratio of the value of Id (on-current) at a certain negative gate voltage to the value of Id (off-current) at a certain positive gate voltage.

The hysteresis can be determined from the absolute value of the difference, $|Vg^1 - Vg^2|$, between a gate voltage $Vg^1$ at Id of $10^{-8}$ A in applying the Vg from positive to negative and a gate voltage $Vg^2$ at Id of $10^{-8}$ A in applying the Vg from negative to positive.

The gate insulating material and the gate insulating film of the present invention can be advantageously used for manufacturing various devices such as a thin film field-effect transistor, a photovoltaic element and a switching element.

EXAMPLES

Hereinafter, the present invention will be described by way of examples, but the present invention is not limited to these examples. Evaluation methods used in these examples will be described in the following paragraphs (1) to (8).

(1) Preparation of Coating Film

A gate insulating material was applied onto a 6-inch silicon wafer and a 6-inch glass substrate in such a manner that the respective dried film thicknesses were 0.5 μm using a spin coater, and was dried at 120° C. for 3 minutes using a hot plate (SCW-636 manufactured by Dainippon Screen Mfg. Co., Ltd.) to obtain coating films.

(2)-1 Preparation of Gate Insulating Film (a)

Gate insulating films were prepared by the following method using a material not having photosensitivity among gate insulating materials. The coating films on the 6-inch silicon wafer and the 6-inch glass substrate, prepared in the above paragraph (1), were heat-treated at a predetermined temperature for a predetermined time to obtain gate insulating films.

(2)-2 Preparation of Gate Insulating Film (b)

Gate insulating films were prepared by the following method using a material having photosensitivity among gate insulating materials. The coating films on the 6-inch silicon wafer and the 6-inch glass substrate, prepared by the method described in the above paragraph (1), were set in ani-line stepper (DSW-8000 manufactured by GCA) and the whole areas of the coating films were exposed with exposure values of 800 mJ/cm². After the exposure, PEB (post exposure bake) of the coating films was carried out for 1 minute on a hot plate of 90° C., and the coating films were developed for 60 seconds with a 2.38% by weight aqueous solution of TMAH (manufactured by MITSUBISHI GAS CHEMICAL COMPANY, INC., ELM-D) and rinsed with pure water. The developed coating films were heat-treated at a predetermined temperature for a predetermined time to prepare gate insulating films.

(3) Measurement of Film Thickness of Gate Insulating Film

The film thickness was measured at a refractive index of 1.55 by use of LAMBDA-ACE STM-602 (manufactured by Dainippon Screen Mfg. Co., Ltd.).

(4) Evaluation of Chemical Resistance

The gate insulating film on the 6-inch silicon wafer, prepared by the method described in the above paragraph (2), was immersed in a mixed solution of dimethylsulfoxide and ethanol (weight ratio 70:30) controlled at 25° C. for 30 minutes. The percentage residual film before and after this immersion was determined. When this value of the percentage residual film is 95 to 105%, the chemical resistance of the gate insulating film is considered good. The percentage residual film was calculated from the following equation.

Percentage residual film (%)=film thickness after immersion/film thickness before immersion×100

(5) Evaluation of Surface Wettability

A water droplet of 1.5 mm in diameter was formed at a tip of a needle at room temperature by use of a contact angle meter (CA-D type manufactured by KYOWA INTERFACE SCIENCE Co., Ltd.), and this droplet was brought into contact with the gate insulating film on the 6-inch silicon wafer, prepared by the method described in the above paragraph (2), to form a droplet on the silicon wafer. The angle formed by the droplet and the surface of the wafer was measured and this angle was taken as a contact angle. When the contact angle is 90° or less, the surface wettability can be regarded as good.

(6) Evaluation of Photosensitivity

The sensitivity and resolution of the coating film on the 6-inch silicon wafer, prepared by the method described in the above paragraph (2)-2, were evaluated using an optical microscope LAMBDA-ACE STM-602. The exposure amount (hereinafter, referred to as an optimum exposure amount), at which a 100 μm line and space pattern is formed at a width ratio of 1:1, was taken as the sensitivity, and the minimum pattern dimension, which was obtained after development at the optimum exposure amount, was taken as the resolution.

(7) Measurement of pH 1 g of water was added to 1 g of the gate insulating material. A pH test paper strip was immersed in the solution and the pH was measured based on the changes in the color.

(8) Measurement of Dielectric Constant

An aluminum electrode was formed on the gate insulating film on the 6-inch silicon wafer, prepared by the method described in the above paragraph (2), by vacuum evaporation and a dielectric constant K was calculated from the following equation (b) based on measurements by use of an LCR meter (manufactured by Hewlett-Packard Japan. Ltd.).

$$K=C\cdot d/(\in \cdot S) \quad (b)$$

In the above equation, C (F) is the capacitance, d (m) is the thickness of an insulating film, E is the dielectric constant ($8.85\times10^{-12}$ F/m) in vacuum, and S ($m^2$) is the area of an upper electrode (aluminum electrode).

Example 1

(1) Preparation of Organic Semiconductor Composite Solution 0.10 g of poly(3-hexyl thiophene) (manufactured by Aldrich, regioregular, number average molecular weight (Mn): 13000, hereinafter referred to as P3HT) as a conjugated polymer was added to 5 ml of chloroform in a flask and the resulting mixture was mixed by ultrasonic agitation in an ultrasonic cleaner (US-2 manufactured by Iuchi Seieido Co., Ltd., output 120 W) to obtain a chloroform solution of P3HT. Next, this solution was taken with a dropper and added dropwise to a mixed solution of 20 ml of methanol and 10 ml of 0.1 N hydrochloric acid in 0.5 ml portions to perform reprecipitation. The solidified P3HT was collected through filtration by a membrane filter (manufactured by PTFE Co.: ethylene tetrafluoride) with a pore size of 0.1 μm and adequately rinsed with methanol, and then the solvent was eliminated by vacuum-drying. Dissolution and reprecipitation were repeated once more to obtain 90 mg of reprecipitated P3HT.

Next, 1.5 mg of a CNT (manufactured by CNI Inc., single-walled CNT, purity 95%, hereinafter referred to as a single-walled CNT) and 1.5 mg of the above P3HT were added to 30 ml of chloroform, and the resulting mixture was mixed at an output of 250 W for 30 minutes by ultrasonic agitation using an ultrasonic homogenizer (VCX-500 manufactured by TOKYO RIKAKIKAI Co., Ltd.) with ice-cooling. Ultrasonic application was stopped once after 30 minutes of application, and 1.5 mg of the P3HT was further added and the ultrasonic wave was further applied for 1 minute to obtain a CNT composite dispersion A (the concentration of the CNT with respect to the solvent 0.05 g/l).

In order to check whether the P3HT adheres to the CNTs in the CNT composite dispersion A or not, 5 ml of the dispersion A was filtered using a membrane filter to collect the CNTs on the filter. The collected CNTs were quickly transferred onto a silicon wafer before the solvent dried to obtain dried CNTs. Elemental analysis of the CNTs was carried out using X-ray photoelectron spectroscopy (XPS), and consequently a sulfur element contained in the P3HT was detected. Therefore, it was confirmed that the P3HT adhered to the CNTs in the CNT composite dispersion A.

Next, chloroform was added to the dispersion A to dilute the dispersion A to a concentration of 0.02 g/l, and the resulting mixture was filtered using a membrane filter (pore size 10 μm, diameter 25 mm, Omnipore membrane manufactured by Millipore Corp.) to eliminate the CNTs having a length of 10 μm or longer. The resulting filtrate was taken as a CNT composite dispersion B. 0.90 mg of the following OSC-1 ([1]) as an organic semiconductor was added to a mixed solution of 0.18 ml of the CNT composite dispersion B and 0.12 ml of chloroform, and an ultrasonic wave was applied to the resulting mixture for 30 minutes using an ultrasonic cleaner (US-2 manufactured by Iuchi Seieido Co., Ltd., output 120 W) to prepare an organic semiconductor solution X. At this time, the concentration of the OSC-1 with respect to chloroform was adjusted to 3 g/l and the concentration of the CNT with respect to the OSC-1 was adjusted to 0.4% by weight.

[Formula 1]

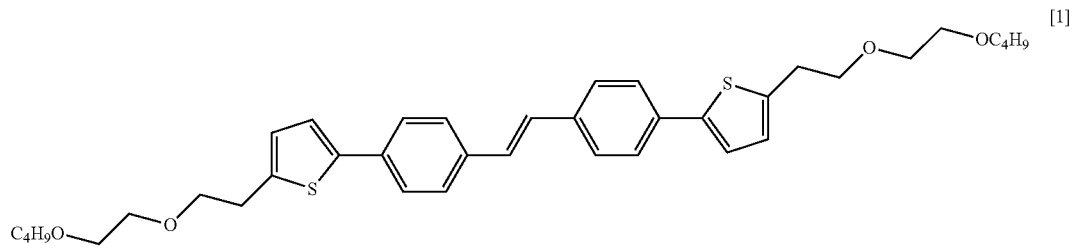

(2) Preparation and Evaluation of Gate Insulating Material 61.3 g (0.45 mol) of methyltrimethoxysilane (hereinafter, referred to as MTMSi), 12.3 g (0.05 mol) of β-(3,4-epoxycyclohexyl)ethyltrimethoxysilane (hereinafter, referred to as β-EpETMSi) and 99.2 g (0.5 mol) of phenyltrimethoxysilane (hereinafter, referred to as PhTMSi) were dissolved in 203.4 g of propylene glycol monobutyl ether (boiling point 170° C., hereinafter, referred to as PGMB), and to the resulting solution, 54.9 g of water and 0.864 g of phosphoric acid were added while stirring the solution. The internal temperature of the resulting solution was raised to 90° C. by heating the solution in a bath of 105° C. for 2 hours to distill off components predominantly composed of methanol as a by-product. Next, the internal temperature of the solution was raised to 118° C. by heating the solution in a bath of 130° C. for 2 hours to distill off components predominantly composed of water and then the solution was cooled to room temperature to obtain a polysiloxane A having a solid concentration of 26.0% by weight.

50.0 g of the polysiloxane A obtained was weighed out and mixed with 16.6 g of PGMB, and the resulting mixture was stirred at room temperature for 2 hours to obtain a gate insulating material A. Next, the gate insulating material A was applied onto a 6-inch silicon wafer and a 6-inch glass substrate in such a manner that the dried film thickness was 0.5 μm using a spin coater, and was dried at 120° C. for 3 minutes using a hot plate (SCW-636 manufactured by Dainippon Screen Mfg. Co., Ltd.) to obtain a coating film. A gate insulating film was prepared by heat-treating the obtained coating film at 200° C. for 60 minutes and chemical resistance and surface-wettability of the gate insulating film were evaluated. The pH of the gate insulating material A was measured to find that it was 3.

(3) Preparation and Evaluation of FET

The FET shown in FIG. 1 was prepared. Chrome and gold were vacuum-deposited onto a glass substrate 1 (film thickness 0.7 mm) through a mask so as to have thicknesses of 5 nm and 50 nm, respectively, by resistance heating to form a gate electrode 2. Next, the gate insulating material A prepared in the above paragraph (2) was applied by spin coating (2000 rpm×30 seconds) onto the glass substrate on which the above-mentioned gate electrode was formed, and the resulting coating film was heat-treated at 200° C. for 1 hour in a nitrogen stream to form a gate insulating layer 3 having a film thickness of 600 nm. Next, gold was vacuum-deposited through a mask so as to have a thickness of 50 nm by resistance heating to form a source electrode 5 and a drain electrode 6.

The width (channel width W) of each of the electrodes was set at 0.5 cm, and the distance (channel length L) between the electrodes was set at 20 μm. 0.1 ml of the organic semiconductor solution X prepared in the above paragraph (1) was added dropwise onto the substrate provided with the electrodes and a semiconductor layer 4 having a thickness of 25 nm was formed by spin coating application (800 rpm×0.3 seconds) of the organic semiconductor solution X. A lead wire was attached to the electrode, and then the resulting FET was heat-treated at 100° C. for 1 hour in a vacuum oven and cooled gradually to 50° C. or lower. Thereafter, the oven was opened to the air and the FET was moved into a measuring box and left standing in vacuum.

Next, characteristics of the source-drain current (Id)—the source-drain voltage (Vsd) in changing the gate voltage (Vg) of the FET were measured. The measurement was carried out in vacuum using Picoammeter/Voltage Source 4140B manufactured by Hewlett-Packard Co. The mobility in a linear region was determined from changes in Id value at the Vsd of −5V in changing the Vg between +50V and −50V to yield 0.2 cm$^2$/V·sec. Further, the on/off ratio was determined from the ratio between the maximum value and the minimum value of the Id at this time to yield 5×10$^5$. Further, hysteresis was determined from the absolute value of the difference in the gate voltage between forward and reverse, $|Vg^1-Vg^2|$, at an Id of 10$^{-8}$ to yield 10 V.

Example 2

95.3 g (0.7 mol) of MTMSi, 24.6 g (0.1 mol) of β-EpET-MSi and 39.7 g (0.2 mol) of PhTMSi were dissolved in 183 g of PGMB, and to the resulting solution, 55.8 g of water and 0.80 g of phosphoric acid were added while stirring the solution. The internal temperature of the resulting solution was raised to 90° C. by heating the solution in a bath of 105° C. for 2 hours to distill off components predominantly composed of methanol as a by-product. Next, the internal temperature of the solution was raised to 118° C. by heating the solution in a bath of 130° C. for 2 hours to distill off components predominantly composed of water and then the solution was cooled to room temperature to obtain a polysiloxane B having a solid concentration of 28.0% by weight. 50.0 g of the polysiloxane B obtained was weighed out and to this, 0.40 g of zirconia tetrakis(acetylacetonate) (hereinafter, referred to as ZrAcAc) as a zirconia-based curing agent was added, and the resulting mixture was mixed with 21.7 g of PGMB and stirred at room temperature for 2 hours to obtain a gate insulating material B. The pH of the gate insulating material B was measured to find that it was 3. Next, a gate insulating film and an FET were prepared and evaluated in the same manner as in Example 1 except that the gate insulating material B was used as a gate insulating material and heating of the coating film was carried out at 180° C. for 60 minutes.

Example 3

40.9 g (0.3 mol) of MTMSi, 73.8 g (0.3 mol) of β-EpET-MSi and 79.3 g (0.4 mol) of PhTMSi were dissolved in 231 g of propylene glycol monopropyl ether (boiling point 150° C., hereinafter, referred to as PGMP), and to the resulting solution, 59.4 g of water and 0.59 g of phosphoric acid were added while stirring the solution. The internal temperature of the resulting solution was raised to 90° C. by heating the solution in a bath of 105° C. for 2 hours to distill off components predominantly composed of methanol as a by-product. Next, the internal temperature of the solution was raised to 118° C. by heating the solution in a bath of 140° C. for 2 hours to distill off components predominantly composed of water and then the solution was cooled to room temperature to obtain a polysiloxane C having a solid concentration of 24.3% by weight. 50.0 g of the poly siloxane C obtained was weighed out and to this, 0.60 g of magnesium bis(acetylacetonate) (trade name NACEM magnesium, manufactured by Nihon Kagaku Sangyo Co., Ltd., hereinafter, referred to as MgAcAc) as a magnesium-based curing agent was added, and the resulting mixture was mixed with 12.3 g of diethylene glycol ethylmethyl ether (boiling point 176° C., hereinafter, referred to as DGEM) and stirred at room temperature for 2 hours to obtain a gate insulating material C. The pH of the gate insulating material C was measured to find that it was 4. Next, a gate insulating film and an FET were prepared and evaluated in the same manner as in Example 1 except that the gate insulating material C was used as a gate insulating material and heating of the coating film was carried out at 230° C. for 5 minutes.

Example 4

66.7 g (0.49 mol) of MTMSi, 2.36 g (0.01 mol) of γ-glycidoxypropyltrimethoxysilane (hereinafter, referred to as γ-GPTMSi) and 99.2 g (0.5 mol) of PhTMSi were dissolved in 471.1 g of propylene glycol monomethyl ether (boiling point 121° C., hereinafter, referred to as PGMM), and to the resulting solution, 54.2 g of water and 0.85 g of phosphoric acid were added while stirring the solution. The internal temperature of the resulting solution was raised to 90° C. by heating the solution in a bath of 105° C. for 2 hours to distill off components predominantly composed of methanol as a by-product. Next, the internal temperature of the solution was raised to 118° C. by heating the solution in a bath of 115° C. for 4 hours to distill off components predominantly composed of water and PGMM and then the solution was cooled to room temperature to obtain a polysiloxane D having a solid concentration of 40.0% by weight. 50.0 g of the polysiloxane D obtained was weighed out and to this, 1.00 g of titanium tetraisopropoxide (hereinafter, referred to as TiTP) was added, and the resulting mixture was mixed with 52.5 g of propylene glycol mono t-butyl ether (boiling point 143° C., hereinafter, referred to as PGMtB) and stirred at room temperature for 2 hours to obtain a gate insulating material D. The pH of the gate insulating material D was measured to find that it was 3. Next, a gate insulating film and an FET were prepared and evaluated in the same manner as in Example 1 except that the gate insulating material D was used as a gate insulating material.

Example 5

50.0 g of the polysiloxane A having a solid concentration of 26.0% by weight, obtained in Example 1, was weighed out and mixed with 16.5 g of PGMB, and to this, 0.10 g of a photo acid generating agent PAI-101 (manufactured by Midori Kagaku Co., Ltd.) and 0.03 g of a sensitizer 9,10-dibuthoxy-anthracene (manufactured by TOKYO KASEI KOGYO Co., Ltd., hereinafter referred to as DBA) were added, and the resulting mixture was stirred at room temperature for 2 hours to obtain a gate insulating material A1. The pH of the gate insulating material A1 was measured to find that it was 3. Photosensitivity of the obtained gate insulating material A1 was evaluated. Next, a gate insulating film and an FET were prepared and evaluated in the same manner as in Example 1 except that the gate insulating material A1 was used as a gate insulating material and heating of the coating film was carried out at 170° C. for 60 minutes.

Example 6

A polysiloxane A2 having a solid concentration of 35% by weight was obtained by synthesizing a polysiloxane in the same manner as in Example 1 except that 200 g (0.66 mol) of silica sol (PL-2L, manufactured by FUSO CHEMICAL Co., Ltd., silica particle concentration 20% by weight) was added. 50.0 g of the polysiloxane A2 obtained was weighed out and to this, 1.00 g of TiTP was added, and the resulting mixture was mixed with 40.0 g of PGMtB and stirred at room temperature for 2 hours to obtain a gate insulating material A2. The pH of the gate insulating material A2 was measured to find that it was 3. Next, a gate insulating film and an FET were prepared and evaluated in the same manner as in Example 1 except that the gate insulating material A2 was used as a gate insulating material and heating of the coating film was carried out at 180° C. for 60 minutes.

Example 7

50.0 g of the polysiloxane A having a solid concentration of 26.0% by weight, obtained in Example 1, was weighed out and mixed with 16.5 g of PGMB, and to this, 0.15 g of a photo acid generating agent PAI-101 and 0.15 g of glutaronitrile (manufactured by TOKYO KASEI KOGYO Co., Ltd., hereinafter referred to as GN) as a compound having a nitrile group were added, and the resulting mixture was stirred at room temperature for 2 hours to obtain a gate insulating material A3. The pH of the gate insulating material A3 was measured to find that it was 3. Next, a gate insulating film and an FET were prepared and evaluated in the same manner as in Example 5 except that the gate insulating material A3 was used as a gate insulating material and heating of the coating film was carried out at 200° C. for 60 minutes.

Example 8

A polysiloxane F having a solid content of 19.5% was obtained by synthesizing a polysiloxane in the same manner as in Example 1 except that the solvent was changed to isopropyl alcohol (boiling point 82.4° C., hereinafter, referred to as IPA) and heating conditions of polycondensation was changed to an internal temperature of 80° C. for 3 hours. 50.0 g of the polysiloxane F obtained was weighed out and to this, 0.60 g of aluminum tris(ethylacetoacetate) (trade name ALCH-TR, manufactured by Kawaken Fine Chemicals Co., Ltd., hereinafter, referred to as AlTEA) as an aluminum-based curing agent was added, and the resulting mixture was stirred at room temperature for 2 hours to obtain a gate insulating material F. The pH of the gate insulating material F was measured to find that it was 3. A coating film was formed with a spin coater using the obtained gate insulating material F, and consequently, film unevenness was partially found since the boiling point of the solvent was low. Next, a gate insulating film and an FET were prepared and evaluated in the same manner as in Example 1 except that the gate insulating material F was used as a gate insulating material and heating of the coating film was carried out at 180° C. for 60 minutes.

Example 9

A polysiloxane G having a solid content of 26.0% was obtained by synthesizing a polysiloxane in the same manner as in Example 1 except that 56.9 g (0.3 mol) of 3-methacry-loyloxypropyltrimethoxysilane-methyltrimethoxysilane (hereinafter, referred to as McTMSi), 24.6 g (0.10 mol) of β-EpETMSi and 139 g (0.6 mol) of PhTMSi were used. 50.0 g of the polysiloxane G obtained was weighed out and to this, 16.6 g of PGMB and 0.60 g of AlTEA were added, and the resulting mixture was stirred at room temperature for 2 hours to obtain a gate insulating material G. The pH of the gate insulating material G was measured to find that it was 3. Next, a gate insulating film and an FET were prepared and evaluated in the same manner as in Example 1 except that the gate insulating material G was used as a gate insulating material.

Comparative Example 1

A polysiloxane H having a solid concentration of 26.5% was obtained by synthesizing a polysiloxane in the same manner as in Example 1 except that 34.1 g (0.25 mol) of MTMSi, 99.2 g (0.5 mol) of PhTMSi and 30.1 g (0.25 mol) of dimethyldimethoxysilane (hereinafter, referred to as DMDMSi) were used.

50.0 g of the polysiloxane H obtained was weighed out and mixed with 16.0 g of PGMB and to this, 0.60 g of AlTEA was added, and the resulting mixture was stirred at room temperature for 2 hours to obtain a gate insulating material H.

Next, a gate insulating film was prepared and its chemical resistance and surface wettability were evaluated in the same manner as in Example 1 except that the gate insulating material H was used as a gate insulating material. Further, though an organic semiconductor composite X was applied onto the gate insulating film by spin coating, cissing occurred and no film was formed.

Comparative Example 2

Polyvinylphenol (manufactured by Aldrich, weight average molecular weight (Mw): 20000, hereinafter referred to as PVP), poly(melamine-co-formaldehyde) (manufactured by Aldrich, number average molecular weight (Mn): 432, hereinafter referred to as PMF) and propylene glycol monomethyl ether acetate (boiling point: 146° C., manufactured by Aldrich, hereinafter referred to as PGMEA) were mixed in a weight ratio of PVP:PMF:PGMEA=10:5:100 to form a gate insulating material I.

Next, a gate insulating film and an FET were prepared and evaluated in the same manner as in Example 1 except that the gate insulating material I was used as a gate insulating material.

Example 10

20.4 g (0.15 mol) of MTMSi, 39.7 g (0.2 mol) of PhTMSi and 37.0 g (0.15 mol) of β-EpETMSi were dissolved in 88.5 g of PGMEA, and to the resulting solution, 29.7 g of water and 0.39 g of phosphoric acid were added while stirring the mixed solution. The resulting solution was heated in a bath of 70° C. for 1 hour to distill off components predominantly composed of methanol as a by-product. Next, the internal temperature of the solution was raised to 110° C. by heating the solution in a bath of 115° C. for 3 hours to distill off components predominantly composed of water and then the solution was cooled to room temperature to obtain a polysiloxane J having a solid concentration of 48.20% by weight.

10.0 g of the polysiloxane J obtained was weighed out and to this, 15.0 g of PGMEA and 0.25 g of ZrAcAc were added, and the resulting mixture was stirred at room temperature for 2 hours to obtain a gate insulating material J.

Next, an FET was prepared and evaluated in the same manner as in Example 1 except that the gate insulating material J was used as a gate insulating material.

Example 11

18.4 g (0.135 mol) of MTMSi, 29.8 g (0.15 mol) of PhTMSi and 3.70 g (0.015 mol) of β-EpETMSi were dissolved in 46.7 g of PGMEA, and to the resulting solution, a mixed solution of 16.5 g of water and 0.21 g of phosphoric acid was added while stirring the solution. The resulting solution was heated in a bath of 70° C. for 1 hour to distill off components predominantly composed of methanol as a by-product. Next, the internal temperature of the solution was raised to 110° C. by heating the solution in a bath of 115° C. for 3 hours to distill off components predominantly composed of water and then the solution was cooled to room temperature to obtain a polysiloxane K having a solid concentration of 48.8% by weight.

10.0 g of the polysiloxane K obtained was weighed out and to this, 15.0 g of PGMEA and 0.25 g of ZrAcAc were added, and the resulting mixture was stirred at room temperature for 2 hours to obtain a gate insulating material K.

Next, an FET was prepared and evaluated in the same manner as in Example 1 except that the gate insulating material K was used as a gate insulating material.

Example 12

6.81 g (0.050 mol) of MTMSi, 19.8 g (0.10 mol) of PhTMSi, 2.64 g (0.010 mol) of β-EpETMSi and 5.96 g (0.0080 mol) of polytetraethoxysilane (trade name SILICATE 40, manufactured by TAMA CHEMICALS Co., Ltd., hereinafter, referred to as PTES) were dissolved in 32.16 g of PGMEA, and to the resulting solution, a mixed solution of 10.6 g of water and 0.14 g of phosphoric acid was added while stirring the solution. The resulting solution was heated in a bath of 70° C. for 1 hour to distill off components predominantly composed of ethanol and methanol as by-products. Next, the internal temperature of the solution was raised to 110° C. by heating the solution in a bath of 115° C. for 3 hours to distill off components predominantly composed of water and then the solution was cooled to room temperature to obtain a polysiloxane L having a solid concentration of 43.9% by weight.

10.0 g of the polysiloxane L obtained was weighed out and to this, 13.0 g of PGMEA and 0.25 g of ZrAcAc were added, and the resulting mixture was stirred at room temperature for 2 hours to obtain a gate insulating material L.

Next, an FET was prepared and evaluated in the same manner as in Example 1 except that the gate insulating material L was used as a gate insulating material.

Example 13

54.5 g (0.4 mol) of MTMSi, 24.6 g (0.1 mol) of β-EpETMSi and 99.2 g (0.5 mol) of PhTMSi were dissolved in 160.0 g of PGMEA, and to the resulting solution, 55.9 g of water and 0.71 g of phosphoric acid were added while stirring the solution. The internal temperature of the resulting solution was raised to 90° C. by heating the solution in a bath of 105° C. for 2 hours to distill off components predominantly composed of methanol as a by-product. Next, the internal temperature of the solution was raised to 118° C. by heating the solution in a bath of 130° C. for 2 hours to distill off components predominantly composed of water and then the solution was cooled to room temperature to obtain a polysiloxane M having a solid concentration of 45.4% by weight. 10.0 g of the polysiloxane M obtained was weighed out and to this, 14.0 g of PGMEA and 0.25 g of ZrAcAc were added, and the resulting mixture was stirred at room temperature for 2 hours to obtain a gate insulating material M.

Next, an FET was prepared and evaluated in the same manner as in Example 1 except that the gate insulating material M was used as a gate insulating material.

Example 14

A gate insulating material N was prepared by synthesizing a polysiloxane N in the same manner as in Example 13 except that β-(3,4-epoxy cyclohexyl)ethylmethyldimethoxysilane (hereinafter, referred to as β-EpEMDMSi) was used in place of β-EpETMSi.

Next, an FET was prepared and evaluated in the same manner as in Example 1 except that the gate insulating material N was used as a gate insulating material.

Example 15

A gate insulating material O was prepared by synthesizing a polysiloxane O in the same manner as in Example 13 except that β-(3,4-epoxy cyclohexyl) propyltrimethoxysilane (hereinafter, referred to as β-EpPTMSi) was used in place of β-EpETMSi.

Next, an FET was prepared and evaluated in the same manner as in Example 1 except that the gate insulating material O was used as a gate insulating material.

Example 16

A gate insulating material P was prepared by synthesizing a polysiloxane P in the same manner as in Example 13 except that γ-glycidoxypropylmethyldimethoxysilane (hereinafter, referred to as γ-GPMDMSi) was used in place of β-EpETMSi.

Next, an FET was prepared and evaluated in the same manner as in Example 1 except that the gate insulating material P was used as a gate insulating material.

Example 17

A gate insulating material Q was prepared by synthesizing a polysiloxane Q in the same manner as in Example 13 except that γ-glycidoxyethyltrimethoxysilane (hereinafter, referred to as γ-GETMSi) was used in place of β-EpETMSi.

Next, an FET was prepared and evaluated in the same manner as in Example 1 except that the gate insulating material Q was used as a gate insulating material.

Example 18

A gate insulating material R was prepared by synthesizing a polysiloxane R in the same manner as in Example 13 except that ethyltrimethoxysilane (hereinafter, referred to as ETMSi) was used in place of MTMSi.

Next, an FET was prepared and evaluated in the same manner as in Example 1 except that the gate insulating material R was used as a gate insulating material.

Example 19

A gate insulating material S was prepared by synthesizing a polysiloxane S in the same manner as in Example 13 except that benzyltrimethoxysilane (hereinafter, referred to as BTMSi) was used in place of MTMSi.

Next, an FET was prepared and evaluated in the same manner as in Example 1 except that the gate insulating material S was used as a gate insulating material.

Example 20

A gate insulating material T was prepared by synthesizing a polysiloxane T in the same manner as in Example 13 except that p-tolyltrimethoxysilane (hereinafter, referred to as ToTMSi) was used in place of PhTMSi.

Next, an FET was prepared and evaluated in the same manner as in Example 1 except that the gate insulating material T was used as a gate insulating material.

Example 21

A gate insulating material U was prepared by synthesizing a polysiloxane U in the same manner as in Example 13 except that β-naphthyltrimethoxysilane (hereinafter, referred to as NaTMSi) was used in place of PhTMSi.

Next, an FET was prepared and evaluated in the same manner as in Example 1 except that the gate insulating material U was used as a gate insulating material.

Example 22

10.0 g of the polysiloxane M obtained in Example 13 was weighed out and to this, 15.0 g of PGMEA, 0.25 g of ZrAcAc and 0.25 g of 3-aminopropyltriethoxysilane (hereinafter, referred to as APTESi) were added, and the resulting mixture was stirred at room temperature for 2 hours to obtain a gate insulating material V.

Next, an FET was prepared and evaluated in the same manner as in Example 1 except that the gate insulating material V was used as a gate insulating material.

Example 23

A gate insulating material W was prepared in the same manner as in Example 22 except that octadecyltriethoxysilane (hereinafter, referred to as OTESi) was used in place of APTESi.

Next, an FET was prepared and evaluated in the same manner as in Example 1 except that the gate insulating material W was used as a gate insulating material.

Example 24

A gate insulating material X was prepared in the same manner as in Example 22 except that p-trifluorophenyltriethoxysilane (hereinafter, referred to as TFPhTESi) was used in place of APTESi.

Next, an FET was prepared and evaluated in the same manner as in Example 1 except that the gate insulating material X was used as a gate insulating material.

Example 25

An FET was prepared and evaluated in the same manner as in Example 13 except that heating conditions of the insulating layer were changed to 200° C. for 1 hour in the air.

Example 26

5.0 g of the polysiloxane J obtained in Example 10 and 5.0 g of the polysiloxane L obtained in Example 12 were weighed out and to this, 15.0 g of PGMEA and 0.25 g of ZrAcAc were added, and the resulting mixture was stirred at room temperature for 2 hours to obtain a gate insulating material Y.

Next, an FET was prepared and evaluated in the same manner as in Example 1 except that the gate insulating material Y was used as a gate insulating material.

Example 27

An FET was prepared and evaluated in the same manner as in Example 13 except that the following OSC-2 ([2]) was used as an organic semiconductor.

[Formula 2]

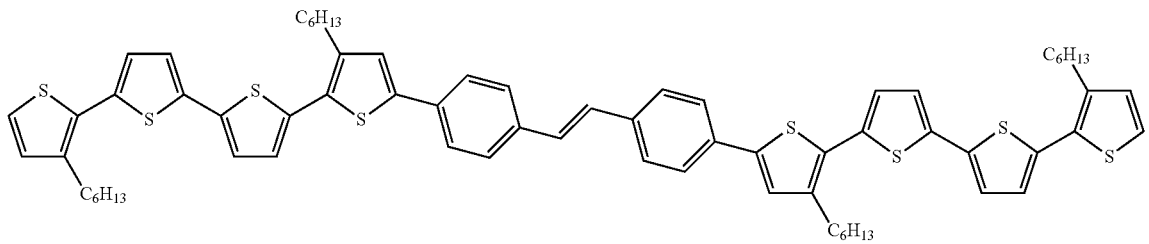

[2]

Example 28

An FET was prepared and evaluated in the same manner as in Example 13 except that P3HT was used as an organic semiconductor.

Example 29

An FET was prepared and evaluated in the same manner as in Example 15 except that CNT was not used.

Structures of the silane compounds used in Examples 1 to 29 are shown below.

[Formula 3]

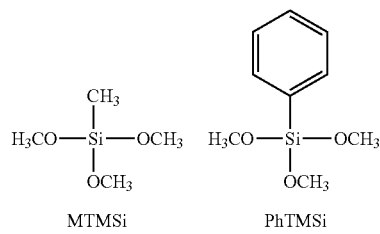
MTMSi     PhTMSi

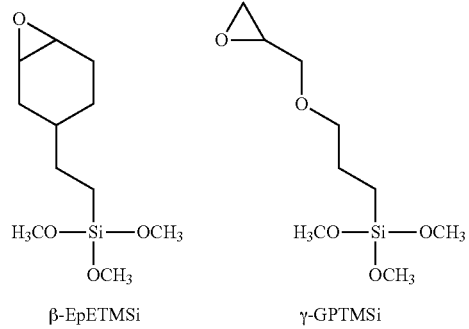
β-EpETMSi     γ-GPTMSi

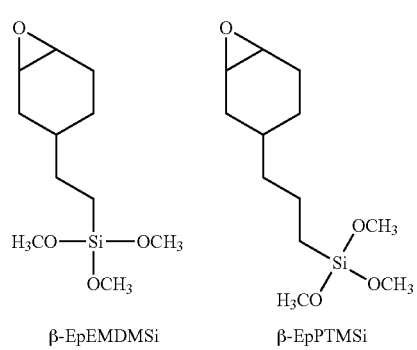
β-EpEMDMSi     β-EpPTMSi

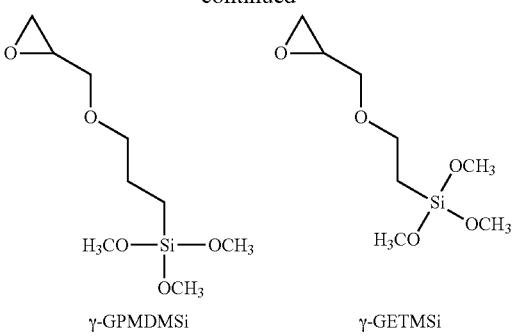
γ-GPMDMSi     γ-GETMSi

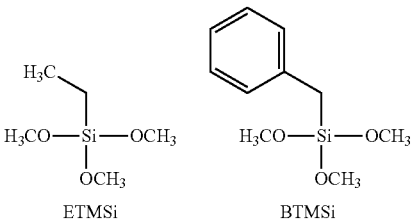
ETMSi     BTMSi

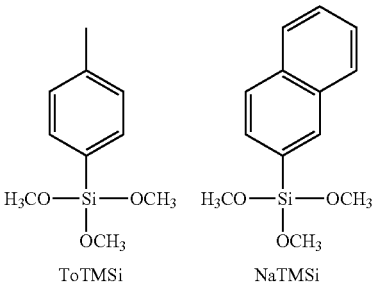
ToTMSi     NaTMSi

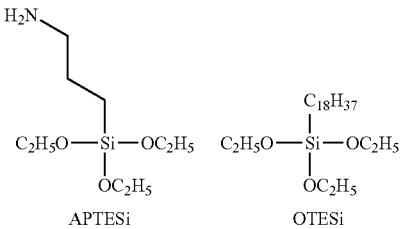
APTESi     OTESi

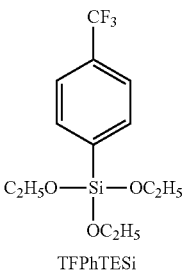
TFPhTESi

Gate insulating material compositions of Examples 1 to 9 and Comparative Examples 1 to 2 are shown in Table 1 and gate insulating material compositions of Examples 10 to 29 are shown in Table 3. Further, the results of FET evaluations of Examples 1 to 9 and Comparative Examples 1 to 2 are shown in Table 2 and the results of FET evaluations of Examples 10 to 29 are shown in Table 4.

TABLE 1

| | Gate insulating material | Polysiloxane | | | | | Solvent | |
| --- | --- | --- | --- | --- | --- | --- | --- | --- |
| | | Epoxy group-containing silane compound of the general formula (2) | Silane compound of the general formula (1) | | | Other silane compound | | |
| Example 1 | A | β-EpETMSi | MTMSi | PhTMSi | — | — | PGMB | — |
| Example 2 | B | β-EpETMSi | MTMSi | PhTMSi | — | — | PGMB | — |
| Example 3 | C | β-EpETMSi | MTMSi | PhTMSi | — | — | PGMP | DGEM |
| Example 4 | D | γ-GPTMSi | MTMSi | PhTMSi | — | — | PGMM | PGMtB |
| Example 5 | A1 | β-EpETMSi | MTMSi | PhTMSi | — | — | PGMB | — |
| Example 6 | A2 | β-EpETMSi | MTMSi | PhTMSi | — | — | PGMtB | — |
| Example 7 | A3 | β-EpETMSi | MTMSi | PhTMSi | — | — | PGMB | — |
| Example 8 | F | β-EpETMSi | MTMSi | PhTMSi | — | — | IPA | — |
| Example 9 | G | β-EpETMSi | McTMSi | PhTMSi | — | — | PGMB | — |
| Comparative Example 1 | H | — | MTMSi | PhTMSi | DMDMSi | — | PGMB | — |
| Comparative Example 2 | I | — | — | — | — | — | PGMEA | — |

| | Particle | Curing agent | Photo acid generating agent | Compound having nitrile | Sensitizer |
| --- | --- | --- | --- | --- | --- |
| Example 1 | — | — | — | — | — |
| Example 2 | — | ZrAcAc | — | — | — |
| Example 3 | — | MgAcAc | — | — | — |
| Example 4 | — | TiTP | — | — | — |
| Example 5 | — | — | PAI-101 | — | DBA |
| Example 6 | silica particle | TiTP | — | — | — |
| Example 7 | — | — | PAI-101 | GN | — |
| Example 8 | — | AlTEA | — | — | — |
| Example 9 | — | AlTEA | — | — | — |
| Comparative Example 1 | — | AlTEA | — | — | — |
| Comparative Example 2 | — | — | — | — | — |

TABLE 2

| | Gate insulating material | Polysiloxane | | Dielectric constant | Chemical resistance Percentage residual film (%) | Surface wettability |
| --- | --- | --- | --- | --- | --- | --- |
| | | Epoxy group-containing silane compound of the general formula (2) (mol %) | Silane compound of the general formula (1) (mol %) | | | |
| Example 1 | A | 5 | 95 | 3.3 | 99 | 80 |
| Example 2 | B | 10 | 90 | 3.4 | 99 | 75 |
| Example 3 | C | 30 | 70 | 3.5 | 98 | 73 |
| Example 4 | D | 1 | 90 | 3.2 | 99 | 85 |
| Example 5 | A1 | 5 | 95 | 3.3 | 99 | 81 |
| Example 6 | A2 | 5 | 95 | 3.9 | 100 | 78 |
| Example 7 | A3 | 5 | 95 | 3.3 | 99 | 80 |
| Example 8 | F | 5 | 95 | 3.3 | 99 | 81 |
| Example 9 | G | 10 | 90 | 3.4 | 104 | 73 |
| Comparative Example 1 | H | — | 100 | 3.2 | 99 | 95 |
| Comparative Example 2 | I | — | — | 3.8 | 108 | 73 |

| | FET characteristics | | | | Photosensitivity | |
| --- | --- | --- | --- | --- | --- | --- |
| | Organic semiconductor layer | Mobility ($cm^2/Vs$) | On/off ratio | Hysteresis | Sensitivity ($mJ/cm^2$) | Resolution (μm) |
| Example 1 | OSC-1/CNT | 0.2 | $5 \times 10^5$ | 10 | — | — |
| Example 2 | OSC-1/CNT | 0.2 | $4 \times 10^5$ | 10 | — | — |

TABLE 2-continued

| | | | | | |
|---|---|---|---|---|---|
| Example 3 | OSC-1/CNT | 0.2 | $5 \times 10^5$ | 20 | — | — |
| Example 4 | OSC-1/CNT | 0.2 | $2 \times 10^5$ | 5 | — | — |
| Example 5 | OSC-1/CNT | 0.2 | $1 \times 10^5$ | 12 | 150 | 10 |
| Example 6 | OSC-1/CNT | 0.3 | $7 \times 10^5$ | 10 | — | — |
| Example 7 | OSC-1/CNT | 0.2 | $8 \times 10^4$ | 12 | 250 | 5 |
| Example 8 | OSC-1/CNT | 0.2 | $8 \times 10^4$ | 12 | — | — |
| Example 9 | OSC-1/CNT | 0.2 | $2 \times 10^5$ | 25 | — | — |
| Comparative Example 1 | OSC-1/CNT | | film was not formed | | | |
| Comparative Example 2 | OSC-1/CNT | 0.2 | $3 \times 10^4$ | 40 | — | — |

TABLE 3

| | Gate insulating material | Polysiloxane | | | | | |
|---|---|---|---|---|---|---|---|
| | | Epoxy group-containing silane compound of the general formula (2) | Silane compound of the general formula (1) | | Other silane compound | Silane compounds other than Polysiloxane | Solvent | Curing agent |
| Example 10 | J | β-EpETMSi | MTMSi | PhTMSi | — | — | PGMEA | ZrAcAc |
| Example 11 | K | β-EpETMSi | MTMSi | PhTMSi | — | — | PGMEA | ZrAcAc |
| Example 12 | L | β-EpETMSi | MTMSi | PhTMSi | PTES | — | PGMEA | ZrAcAc |
| Example 13 | M | β-EpETMSi | MTMSi | PhTMSi | — | — | PGMEA | ZrAcAc |
| Example 14 | N | β-EpEMDMSi | MTMSi | PhTMSi | — | — | PGMEA | ZrAcAc |
| Example 15 | O | β-EpPTMSi | MTMSi | PhTMSi | — | — | PGMEA | ZrAcAc |
| Example 16 | P | γ-GPMDMSi | MTMSi | PhTMSi | — | — | PGMEA | ZrAcAc |
| Example 17 | Q | γ-GETMSi | MTMSi | PhTMSi | — | — | PGMEA | ZrAcAc |
| Example 18 | R | β-EpETMSi | ETMSi | PhTMSi | — | — | PGMEA | ZrAcAc |
| Example 19 | S | β-EpETMSi | BTMSi | PhTMSi | — | — | PGMEA | ZrAcAc |
| Example 20 | T | β-EpETMSi | MTMSi | ToTMSi | — | — | PGMEA | ZrAcAc |
| Example 21 | U | β-EpETMSi | MTMSi | NaTMSi | — | — | PGMEA | ZrAcAc |
| Example 22 | V | β-EpETMSi | MTMSi | PhTMSi | — | APTESi | PGMEA | ZrAcAc |
| Example 23 | W | β-EpETMSi | MTMSi | PhTMSi | — | OTESi | PGMEA | ZrAcAc |
| Example 24 | X | β-EpETMSi | MTMSi | PhTMSi | — | TFPhTESi | PGMEA | ZrAcAc |
| Example 25 | M | β-EpETMSi | MTMSi | PhTMSi | — | — | PGMEA | ZrAcAc |
| Example 26 | Y | β-EpETMSi | MTMSi | PhTMSi | — | — | PGMEA | ZrAcAc |
| Example 27 | M | β-EpETMSi | MTMSi | PhTMSi | PTES | — | PGMEA | ZrAcAc |
| Example 28 | M | β-EpETMSi | MTMSi | PhTMSi | — | — | PGMEA | ZrAcAc |
| Example 29 | M | β-EpETMSi | MTMSi | PhTMSi | — | — | PGMEA | ZrAcAc |

TABLE 4

| | Gate insulating material | Organic semiconductor layer | FET characteristics | | |
|---|---|---|---|---|---|
| | | | Mobility (cm2/Vs) | On/off ratio | Hysteresis |
| Example 10 | J | OSC-1/CNT | 0.2 | $2 \times 10^5$ | 18 |
| Example 11 | K | OSC-1/CNT | 0.2 | $8 \times 10^5$ | 8 |
| Example 12 | L | OSC-1/CNT | 0.3 | $3 \times 10^5$ | 5 |
| Example 13 | M | OSC-1/CNT | 0.3 | $6 \times 10^5$ | 10 |
| Example 14 | N | OSC-1/CNT | 0.3 | $5 \times 10^5$ | 9 |
| Example 15 | O | OSC-1/CNT | 0.3 | $4 \times 10^5$ | 11 |
| Example 16 | P | OSC-1/CNT | 0.3 | $5 \times 10^5$ | 9 |
| Example 17 | Q | OSC-1/CNT | 0.3 | $3 \times 10^5$ | 9 |
| Example 18 | R | OSC-1/CNT | 0.3 | $2 \times 10^5$ | 12 |
| Example 19 | S | OSC-1/CNT | 0.3 | $2 \times 10^5$ | 12 |
| Example 20 | T | OSC-1/CNT | 0.3 | $5 \times 10^5$ | 10 |
| Example 21 | U | OSC-1/CNT | 0.3 | $3 \times 10^5$ | 13 |
| Example 22 | V | OSC-1/CNT | 0.2 | $5 \times 10^5$ | 15 |
| Example 23 | W | OSC-1/CNT | 0.3 | $1 \times 10^5$ | 9 |
| Example 24 | X | OSC-1/CNT | 0.4 | $8 \times 10^4$ | 8 |
| Example 25 | M | OSC-1/CNT | 0.3 | $3 \times 10^5$ | 11 |
| Example 26 | Y | OSC-1/CNT | 0.2 | $4 \times 10^5$ | 13 |
| Example 27 | M | OSC-2/CNT | 0.2 | $5 \times 10^5$ | 7 |
| Example 28 | M | P3HT/CNT | 0.05 | $3 \times 10^5$ | 6 |
| Example 29 | M | OSC-2 | 0.02 | $3 \times 10^4$ | 3 |

Industrial Applicability

The gate insulating material and the gate insulating film of the present invention are used for organic field-effect transistors, which are applicable to smart cards, security tags and transistor arrays for a flat panel display, and other organic transistors.

The invention claimed is:

1. A gate insulating material comprising a polysiloxane consisting essentially of, as copolymerization components, at least a silane compound represented by the general formula (1):

$$R^1{}_m Si(OR^2)_4 \quad (1),$$

wherein $R^1$ represents hydrogen, an alkyl group, a cycloalkyl group, a heterocyclic group, an aryl group, a heteroaryl group or an alkenyl group and in the case where a plurality of $R^1$s are present, $R^1$s may be the same or different, $R^2$ represents an alkyl group or a cycloalkyl group and in the case where a plurality of $R^2$s are present, $R^2$s may be the same or different, and m represents an integer of 1 to 3, and an epoxy group-containing silane compound represented by the general formula (2):

$$R^3{}_n R^4{}_l Si(OR^5)_{4-n-l} \quad (2),$$

wherein $R^3$ represents an alkyl group or a cycloalkyl group having one or more epoxy groups in a part of a chain and in the case where a plurality of $R^3$s are present, $R^3$s may be the same or different, $R^4$ represents hydrogen, an alkyl group, a cycloalkyl group, a heterocyclic group, an aryl group, a heteroaryl group or an alkenyl group and in the case where a plurality of $R^4$s are present, $R^4$s may be the same or different, $R^5$ represents an alkyl group or a cycloalkyl group and in the case where a plurality of $R^5$s are present, $R^5$s may be the same or different, l represents an integer of 0 to 2, and n represents 1 or 2 (however, $1+n \leq 3$).

2. The gate insulating material according to claim 1, wherein at least one of m $R^1$s in the general formula (1) is an aryl group or a heteroaryl group.

3. The gate insulating material according to claim 1, wherein the content of a constituent unit, which is derived from the epoxy group-containing silane compound represented by the general formula (2), in the polysiloxane is 0.1 to 40 mol %.

4. The gate insulating material according to claim 1, further comprising a solvent having a boiling point of 110 to 200° C. at a pressure of 1 atmosphere.

5. The gate insulating material according to claim 1, further comprising a particle.

6. The gate insulating material according to claim 1, further comprising a metal alkoxide compound and/or a metal chelate compound as a curing agent.

7. The gate insulating material according to claim 1, further comprising a compound which generates an acid by light.

8. The gate insulating material according to claim 1, wherein the pH of the gate insulating material is 2 to 7.

9. A gate insulating film obtained by heat-treating, at a temperature of 100 to 300° C., a coating film formed by applying the gate insulating material according to claim 1 to a substrate.

10. An organic field-effect transistor comprising a gate insulating layer containing the gate insulating film according to claim 9, a gate electrode, a semiconductor layer, a source electrode and a drain electrode.

11. A method of manufacturing a gate insulating material comprising forming a polysiloxane in presence of an acid catalyst, the polysiloxane having, as copolymerization components, at least a silane compound represented by the general formula (1):

$$R^1{}_m Si(OR^2)_4 \quad (1),$$

wherein $R^1$ represents hydrogen, an alkyl group, a cycloalkyl group, a heterocyclic group, an aryl group, a heteroaryl group or an alkenyl group and in the case where a plurality of $R^1$s are present, $R^1$s may be the same or different, $R^2$ represents an alkyl group or a cycloalkyl group and in the case where a plurality of $R^2$s are present, $R^2$s may be the same or different, and m represents an integer of 1 to 3, and an epoxy group-containing silane compound represented by the general formula (2):

$$R^3{}_n R^4{}_l Si(OR^5)_{4-n-l} \quad (2),$$

wherein $R^3$ represents an alkyl group or a cycloalkyl group having one or more epoxy groups in a part of a chain and in the case where a plurality of $R^3$s are present, $R^3$s may be the same or different, $R^4$ represents hydrogen, an alkyl group, a cycloalkyl group, a heterocyclic group, an aryl group, a heteroaryl group or an alkenyl group and in the case where a plurality of $R^4$s are present, $R^4$s may be the same or different, $R^5$ represents an alkyl group or a cycloalkyl group and in the case where a plurality of $R^5$s are present, $R^5$s may be the same or different, l represents an integer of 0 to 2, and n represents 1 or 2 (however, $1+n \leq 3$).

12. A gate insulating material comprising forming a a carbon nanotube and a polysiloxane having, as copolymerization components, at least a silane compound represented by the general formula (1):

$$R^1{}_m Si(OR^2)_4 \quad (1),$$

wherein $R^1$ represents hydrogen, an alkyl group, a cycloalkyl group, a heterocyclic group, an aryl group, a heteroaryl group or an alkenyl group and in the case where a plurality of $R^1$s are present, $R^1$s may be the same or different, $R^2$ represents an alkyl group or a cycloalkyl group and in the case where a plurality of $R^2$s are present, $R^2$s may be the same or different, and m represents an integer of 1 to 3, and an epoxy group-containing silane compound represented by the general formula (2):

$$R^3{}_n R^4{}_l Si(OR^5)_{4-n-l} \quad (2),$$

wherein $R^3$ represents an alkyl group or a cycloalkyl group having one or more epoxy groups in a part of a chain and in the case where a plurality of $R^3$s are present, $R^3$s may be the same or different, $R^4$ represents hydrogen, an alkyl group, a cycloalkyl group, a heterocyclic group, an aryl group, a heteroaryl group or an alkenyl group and in the case where a plurality of $R^4$s are present, $R^4$s may be the same or different, $R^5$ represents an alkyl group or a cycloalkyl group and in the case where a plurality of $R^5$s are present, $R^5$s may be the same or different, l represents an integer of 0 to 2, and n represents 1 or 2 (however, $1+n \leq 3$).

* * * * *